US011115008B2

(12) United States Patent
Maru et al.

(10) Patent No.: US 11,115,008 B2
(45) Date of Patent: Sep. 7, 2021

(54) SINGLE EVENT UPSET-TOLERANT LATCH CIRCUIT AND FLIP-FLOP CIRCUIT

(71) Applicants: Japan Aerospace Exploration Agency, Tokyo (JP); High-Reliability Engineering & Components Corporation, Tsukuba (JP)

(72) Inventors: Akifumi Maru, Tokyo (JP); Satoshi Kuboyama, Tokyo (JP); Tsukasa Ebihara, Kawasaki (JP); Akiko Makihara, Tsukuba (JP)

(73) Assignees: Japan Aerospace Exploration Agency, Tokyo (JP); High-Reliability Engineering & Components Corporation, Tsukuba (JP)

( * ) Notice: Subject to any disclaimer, the term of this patent is extended or adjusted under 35 U.S.C. 154(b) by 81 days.

(21) Appl. No.: 16/621,691

(22) PCT Filed: May 16, 2018

(86) PCT No.: PCT/JP2018/018955
§ 371 (c)(1),
(2) Date: Dec. 11, 2019

(87) PCT Pub. No.: WO2018/230235
PCT Pub. Date: Dec. 20, 2018

(65) Prior Publication Data
US 2021/0194470 A1 Jun. 24, 2021

(30) Foreign Application Priority Data
Jun. 12, 2017 (JP) .............................. JP2017-115206

(51) Int. Cl.
*H03K 3/037* (2006.01)

(52) U.S. Cl.
CPC ......... *H03K 3/0375* (2013.01); *H03K 3/0372* (2013.01)

(58) Field of Classification Search
CPC ............... H03K 3/0375; H03K 3/0372; H03K 3/356191
See application file for complete search history.

(56) References Cited

U.S. PATENT DOCUMENTS 6,327,176 B1   12/2001  Li et al.
6,696,873 B2    2/2004  Hazucha et al.
(Continued)

FOREIGN PATENT DOCUMENTS

JP   2009-118335 A   5/2009

OTHER PUBLICATIONS

Calin et al., "Upset Hardened Memory Design for Submicron CMOS Technology," IEEE Transactions on Nuclear Science, Dec. 1996, pp. 2874-2878, vol. 43, No. 6, Grenoble, France.
(Continued)

*Primary Examiner* — Sibin Chen
(74) *Attorney, Agent, or Firm* — Womble Bond Dickinson (US) LLP

(57) ABSTRACT

Provided are a latch circuit and a flip-flop circuit each having more excellent tolerance to single event upset (SEU). The single event upset (SEU)-tolerant latch circuit of the present invention is configured such that three transistors for redundancy are added to each of eight transistors constituting a conventional DICE latch circuit, at respective positions consisting of a serial position, a parallel position and a parallel-serial position so as to form a four-transistor circuit in which a serially duplicated circuit is duplicated in parallel, and each of a first data input part and a second data input part is also made dually redundant.

12 Claims, 34 Drawing Sheets

(56) References Cited

U.S. PATENT DOCUMENTS

| 6,696,874 B2 | 2/2004 | Wood |
| 2004/0017237 A1 | 1/2004 | Wood |
| 2009/0121765 A1* | 5/2009 | Yamamoto ....... H03K 3/356191 |
| | | 327/208 |

OTHER PUBLICATIONS

The International Search Report of the International Searching Authority for PCT Application No. PCT/JP2018/018955 dated Aug. 14, 2018 with English Translation, 5 pages.

The Written Opinion of the International Searching Authority for PCT Application No. PCT/JP2018/018955 dated Aug. 14, 2018, 5 pages.

* cited by examiner

FIG.4
| X1_*~X4_*_Status | HDE1 | HDE2 | HDE3 | HDE4 |
|---|---|---|---|---|
| 0101 | Isolated | Latch | Isolated | Latch |
| 1010 | Latch | Isolated | Latch | Isolated |
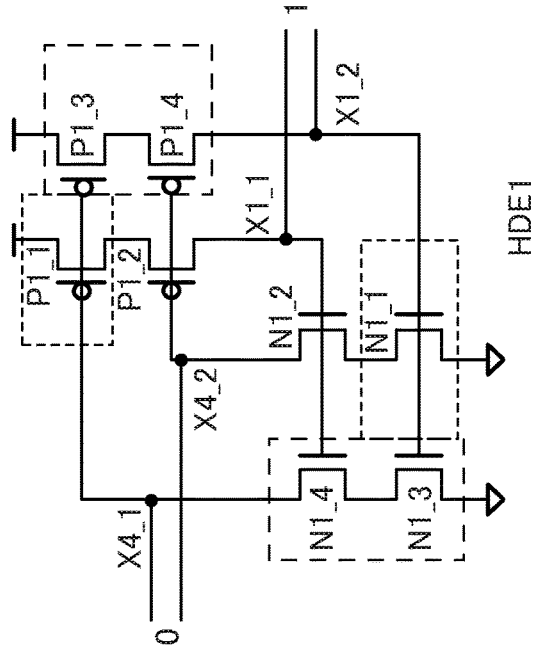
HyperDICE element = Latch state
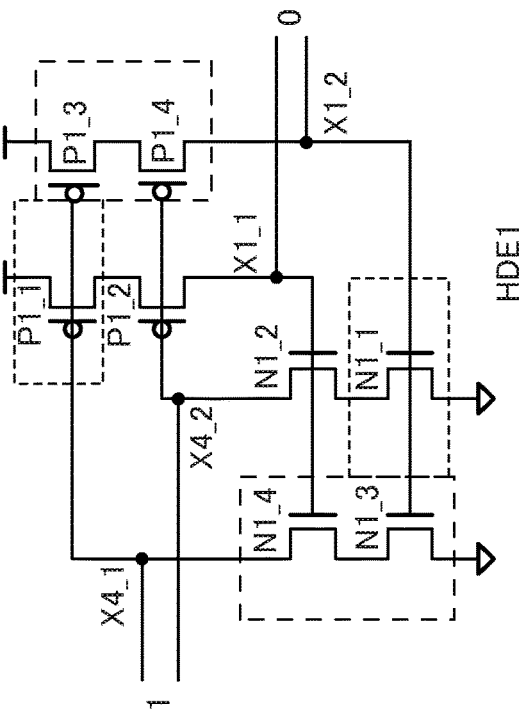
HyperDICE element = Isolated state HyperDICE Latch Circuit (HDL)

Output Buffer part (OBF)

Table of Truth Values of HyperDICE Latch Circuit (HDL)

| CK | D | Q | Remarks |
|---|---|---|---|
| 0 | 0 | 0 | Data-through state |
| 0 | 1 | 1 | |
| 1 | X | Q | Data latch state |

FIG.9A
[Principle of SEU resistance of HyperDICE Latch Circuit (in Normal Operation)]
| X1_*~X4_* Status | HDE1 | HDE2 | HDE3 | HDE4 |
|---|---|---|---|---|
| 0101 | Isolated | Latch | Isolated | Latch |
| 1010 | Latch | Isolated | Latch | Isolated |
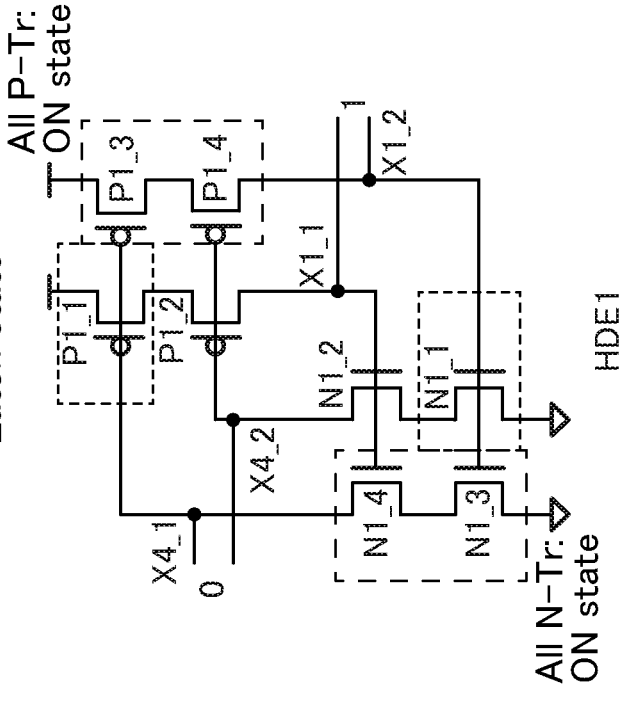
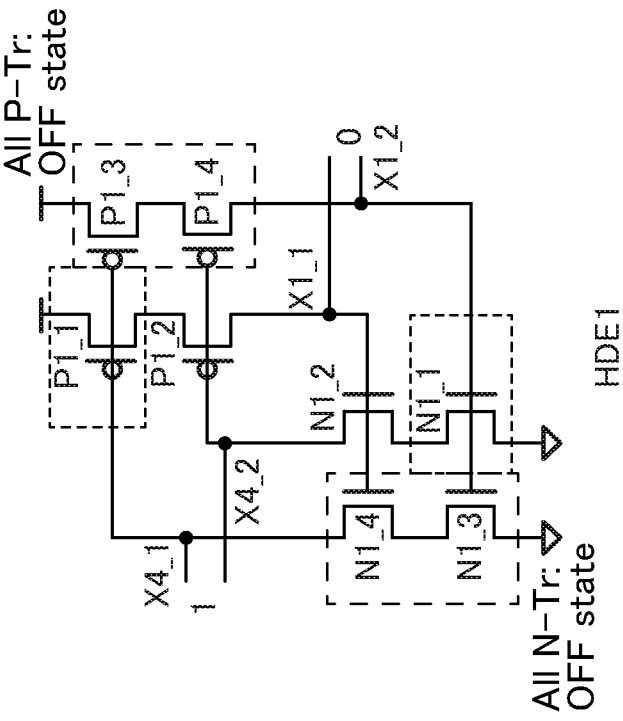

[Principle of SEU resistance of HyperDICE Latch Circuit (in case 1 where no SEU occurs)]

FIG.9C
[Principle of SEU resistance of HyperDICE Latch Circuit (in case 2 where no SEU occurs)]
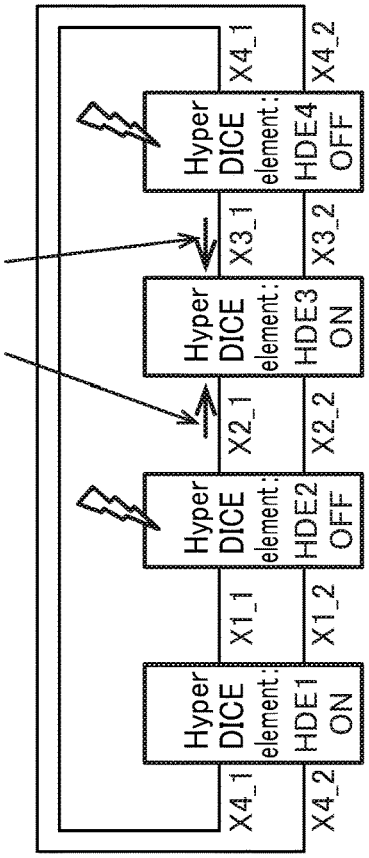
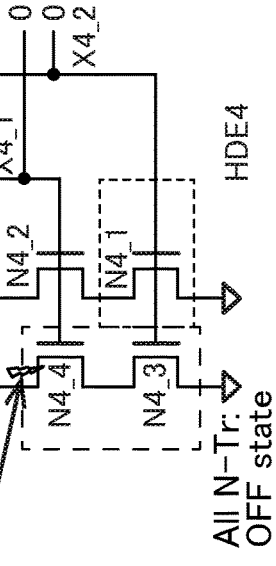
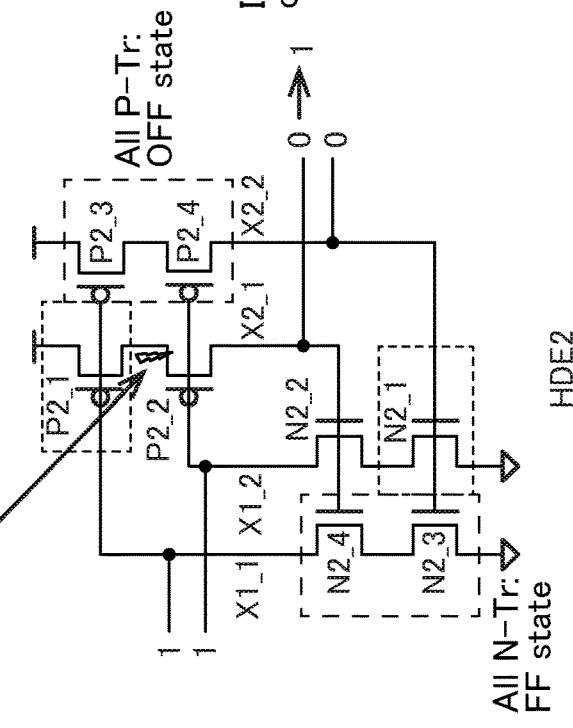

FIG.11

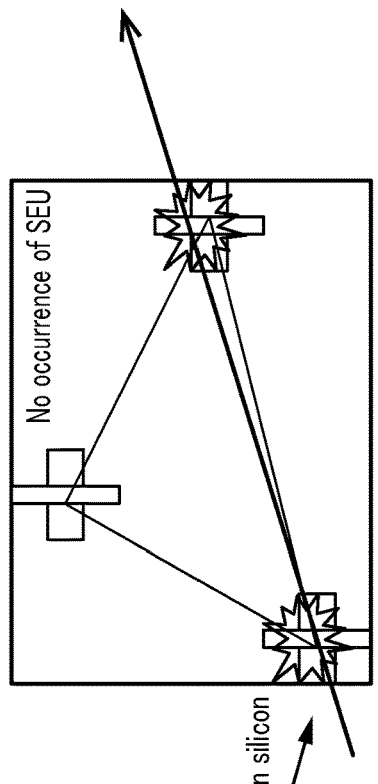

(a) Conventional DICE circuit
When two critical transistors are arranged on a trajectory of an incident particle, there is a risk of simultaneous inversion.

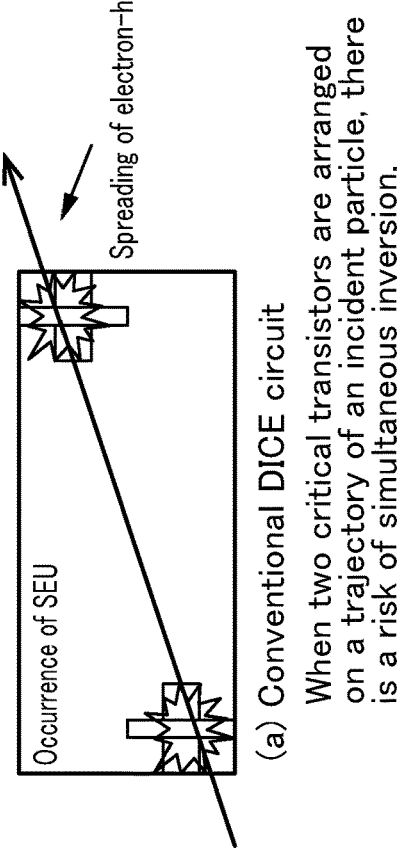

(b) HyperDICE circuit
As the area of opening of a rectangle having vertices at three critical transistors becomes larger, a risk that the three critical transistors are simultaneously inverted by the same incident particle to cause the occurrence of SEU becomes lower.

FIG.14

Combinations of transistors which should never be simultaneously inverted

| # | Conditions | Critical Tri-Transistor | | | |
|---|---|---|---|---|---|
| | | HDE1 | HDE2 | HDE3 | HDE4 |
| 1 | HDE 1 and HDE 3 are in isolated state (1) | P1_2/P1_4 | NA | N3_2 | NA |
| 2 | HDE 1 and HDE 3 are in isolated state (2) | P1_2/P1_4 | NA | N3_4 | NA |
| 3 | HDE 1 and HDE 3 are in isolated state (3) | N1_2/N1_4 | NA | N3_2 | NA |
| 4 | HDE 1 and HDE 3 are in isolated state (4) | N1_2/N1_4 | NA | N3_4 | NA |
| 5 | HDE 1 and HDE 3 are in isolated state (5) | N1_2 | NA | P3_2/P3_4 | NA |
| 6 | HDE 1 and HDE 3 are in isolated state (6) | N1_4 | NA | P3_2/P3_4 | NA |
| 7 | HDE 1 and HDE 3 are in isolated state (7) | N1_2 | NA | N3_2/N3_4 | NA |
| 8 | HDE 1 and HDE 3 are in isolated state (8) | N1_4 | NA | N3_2/N3_4 | NA |
| 9 | HDE 2 and HDE 4 are in isolated state (1) | NA | P2_2/P2_4 | NA | N4_2 |
| 10 | HDE 2 and HDE 4 are in isolated state (2) | NA | P2_2/P2_4 | NA | N4_4 |
| 11 | HDE 2 and HDE 4 are in isolated state (3) | NA | N2_2/N2_4 | NA | N4_2 |
| 12 | HDE 2 and HDE 4 are in isolated state (4) | NA | N2_2/N2_4 | NA | N4_4 |
| 13 | HDE 2 and HDE 4 are in isolated state (5) | NA | N2_4 | NA | P4_2/P4_4 |
| 14 | HDE 2 and HDE 4 are in isolated state (6) | NA | N2_4 | NA | N4_2/N4_4 |

Hyper DICE elements
(HDE 2 and HDE 3)

Layout (1/3)

Layout (2/3)

Hyper DICE elements
(HDE 1 and HDE 4)

Layout (2/3)

Layout (3/3)

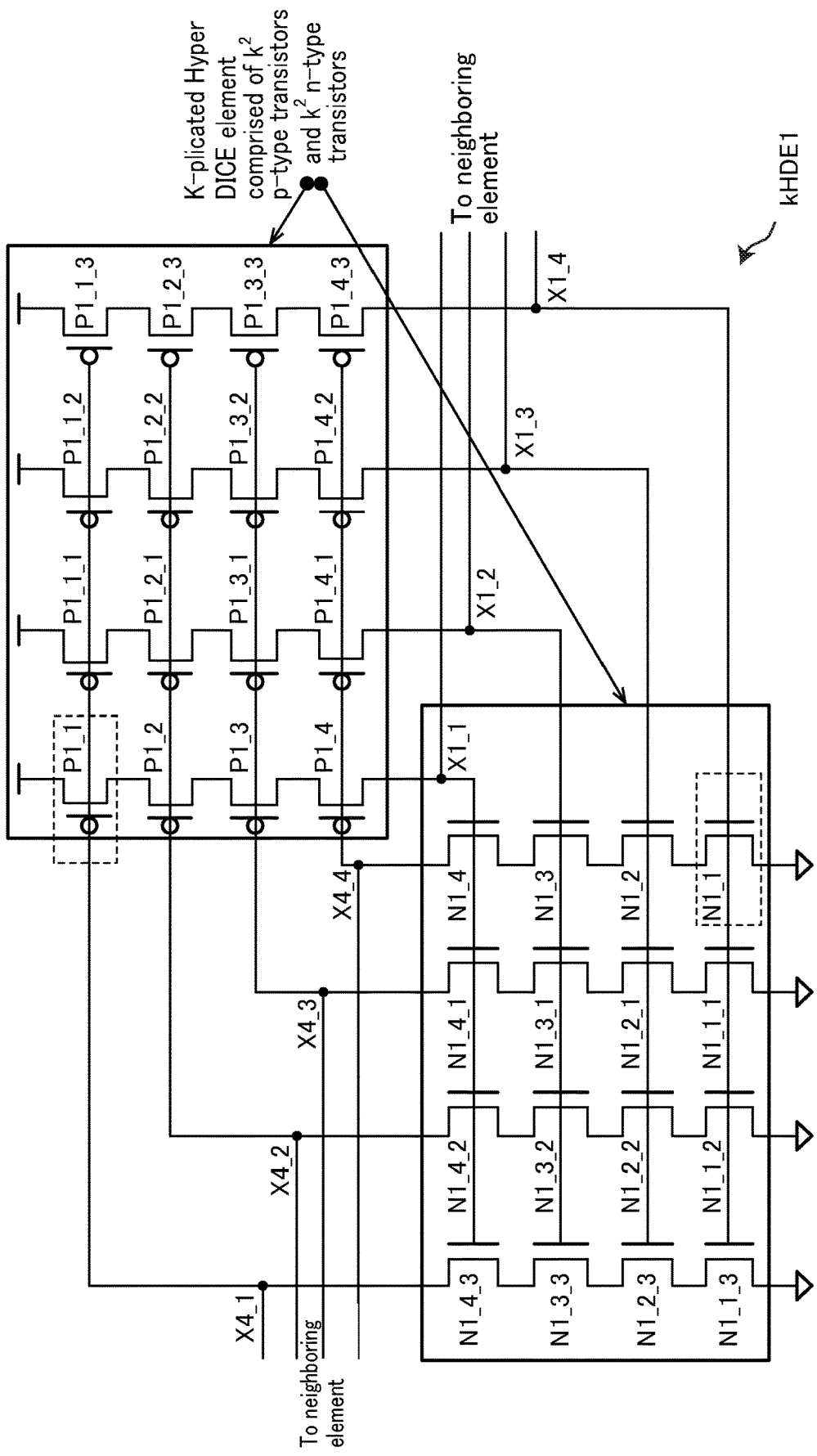

(1) Research Paper regarding DICE (DICE Memory Cell) (TIMA)

(2) US 6,696,873 B2 (Intel)

(3) US 6,327,176 B1 (BAE)

(4) US 2004/0017237 A1 (BAE)
(5) US 6,696,874 B2 (BAE)

| X1~X4 status | DICE Element 1 | DICE Element 2 | DICE Element 3 | DICE Element 4 |
|---|---|---|---|---|
| 0101 | Isolated | Latch | Isolated | Latch |
| 1010 | Latch | Isolated | Latch | Isolated |

DICE element = Isolated state

DICE element = Latch state

[Principle of SEU Resistance of DICE Circuit (Case where no SEU occurs)]

FIG.29
[Critical Transistor Pair causing Occurrence of SEU in DICE Circuit]
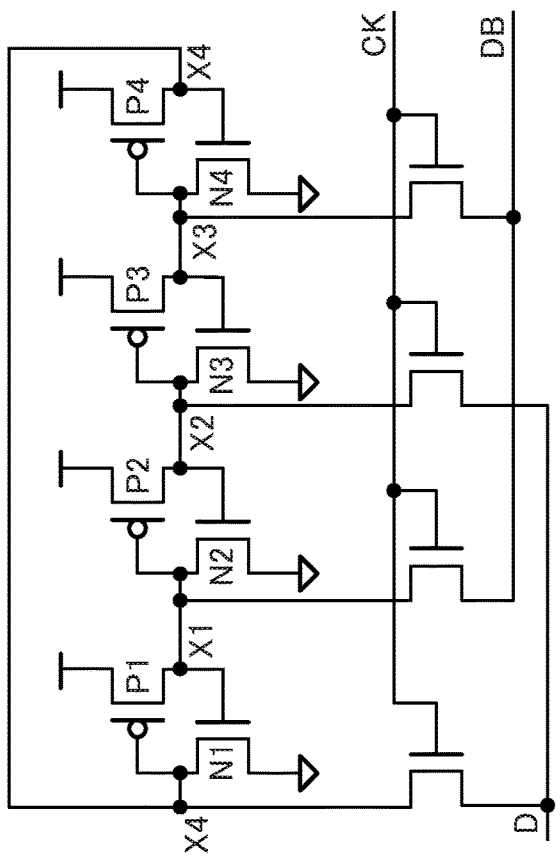
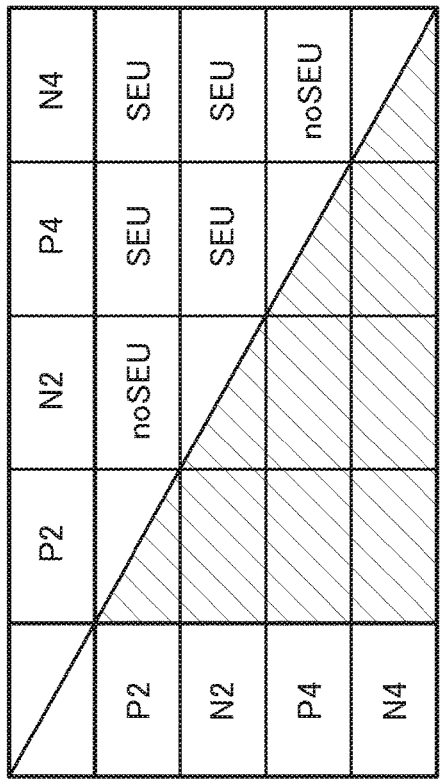
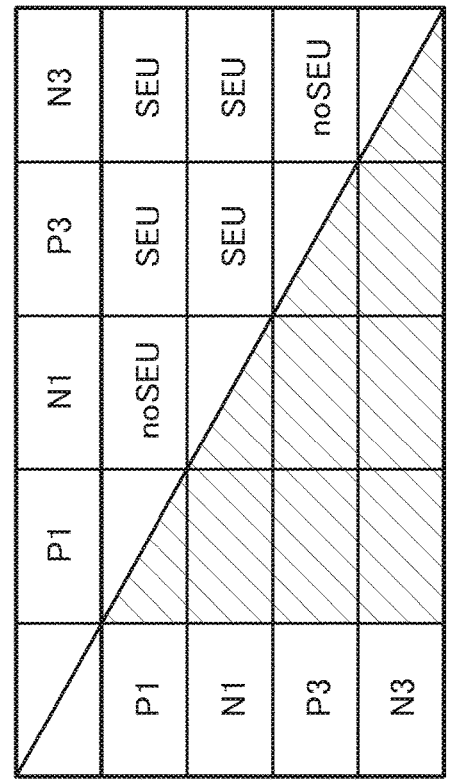
Total 8 combinations

SINGLE EVENT UPSET-TOLERANT LATCH CIRCUIT AND FLIP-FLOP CIRCUIT

CROSS-REFERENCE TO RELATED APPLICATIONS

This patent application is a U.S. National Phase Application Under 35 U.S.C § 371 of International Application No. PCT/JP2018/018955, filed May 16, 2018, entitled "Single Event Upset-Tolerant Latch Circuit And Flip-Flop Circuit," which claims the benefit of priority of Japanese Patent Application No. 2017-115206, filed on Jun. 12, 2017.

TECHNICAL FIELD

The present invention relates to a latch circuit and a flip-flop circuit, and more specifically to a latch circuit and a flip-flop circuit each tolerant to single event upset (SEU).

BACKGROUND ART

In a semiconductor memory element such as a data latch circuit or a flip-flop circuit, when a high energy particle such as a radioactive particle or an ion particle penetrates a transistor constituting the element, electron-hole pairs are likely to be produced inside the transistor by the action of the energy particle, such as ionization and excitation, and thus electron charges are generated. The generated electric charges flow in a region which varies depending on an electric field applied to a p-n junction in the transistor (charge collection), so that the transistor in an OFF state is likely to be wrongly operated so as to be temporarily turned on. In this case, a current which would never flow in a normal state flows inside the transistor, leading to the occurrence of a malfunction that data memorized by the semiconductor memory element such as a latch circuit or a flip-flop circuit is inverted. This phenomenon is referred to as "single event upset (SEU)", which is one of the single event phenomenon causing the malfunction.
(Conventional DICE Circuit)

As a conventional circuit which has the SEU tolerance, one type of latch circuit, called "DICE (Dual Interlocked Storage Cell) circuit" is known. The conventional DICE circuit will be described below. FIG. 20 is a circuit diagram of a DICE circuit described in FIG. 4 on page 2877 of the research paper titled "Upset Hardened Memory Design for Submicron CMOS Technology" (Non-Patent Document 1) (wherein the transistor numbers have been renumbered). This is an original DICE circuit in the research paper published by researchers in TIMA which is a research institute in France. In the figure, a circuit is described in which four elements each comprised of a p-type transistor and an n-type transistor connected in series are connected to each other in a loop configuration. In each of the elements, a gate terminal of the p-type transistor is connected to a node interconnecting between the p-type transistor and the n-type transistor of a forward one of the remaining elements, and a gate terminal of the n-type transistor is connected to a node interconnecting between the p-type transistor and the n-type transistor of a backward one of the remaining elements.

FIG. 21 is a circuit diagram of a DICE circuit described in U.S. Pat. No. 6,696,873 B2 (Patent Document 1), wherein the transistor numbers have been renumbered. This also describes a circuit in which four elements each comprised of a p-type transistor and an n-type transistor connected in series are connected to each other in a loop configuration. FIG. 22 is a circuit diagram of a DICE circuit described in U.S. Pat. No. 6,327,176 B2 (Patent Document 2), wherein the transistor numbers have been renumbered. This also describes a circuit in which four elements each comprised of a p-type transistor and an n-type transistor connected in series are connected to each other in a loop configuration. FIG. 23 is a circuit diagram of a DICE circuit described in US 2004/0017237 A1 (Patent Document 3) and U.S. Pat. No. 6,696,874 B2 (Patent Document 4), wherein the transistor numbers have been renumbered. This also describes a circuit in which four elements each comprised of a p-type transistor and an n-type transistor (in a part of the elements, a transistor for clock input is added) connected in series are connected to each other in a loop configuration. Each of the circuits described in FIGS. 21 to 23 was filed as a patent application in the U.S. by a U.S. semiconductor company after the publication of the research paper regarding the original DICE circuit. These circuits are slightly different from the original DICE circuit only in terms of a clock input part.

The DICE circuits described in FIGS. 20 to 23 resemble each other in that each of them has a circuit for a memory section in which four elements each comprised of a p-type transistor and an n-type transistor connected in series are connected to each other in a loop configuration, although there is a difference thereamong in terms of a clock input part.

FIG. 24 is a circuit diagram of two equivalent DICE circuits represented by using two types of representation methods. In a circuit described on the left side, four elements each comprised of a p-type transistor and an n-type transistor connected in series are connected to each other in a loop configuration. On the other hand, in a circuit described on the right side, four elements each comprised of a p-type transistor and an n-type transistor in which a drain terminal and a gate terminal of one of them is connected, respectively, to a gate terminal and a drain terminal of the other are connected to each other in a loop configuration (this type of element will hereinafter be referred to as "DICE element"). The two circuits simply become different from each other in terms of representation, depending on what kind of unit circuit each of them is based on, and represent two completely equivalent DICE circuits, respectively, as a whole. In this specification, the element in the circuit presented on the right side of FIG. 24 will be referred to as "DICE element", and the following description will be made using this term. However, it should be understood that the following description can be made in the same manner, even using the circuit represented on the left side of FIG. 24. FIG. 25 is a block diagram representing a DICE circuit as a circuit composed of a plurality of DICE elements. Such a DICE circuit is configured such that four DICE elements consisting of DICE elements 1 to 4 are connected to each other in a loop configuration. Interconnections between adjacent ones of the DICE elements are formed via four nodes consisting of nodes X1 to X4, respectively.

The operation of the conventional DICE circuit will be described below. FIG. 26 is an explanatory diagram of a data storage operation of the DICE circuit. FIG. 26 represents the operation in a case of assuming that the DICE circuit is comprised of the DICE elements. As shown in the lower left diagram in FIG. 26, the DICE element enters an isolated state when all the transistors of the DICE element are in an OFF state, wherein, with regard to an input-output state of the DICE element at this time, gate input in the p-type transistor and drain output in the n-type transistor is in a High (1) state, and gate input in the n-type transistor and drain output in the p-type transistor is in a Low (0) state. On the other hand, as shown in the lower right diagram in FIG. 26, the DICE element enters a latch state when all the transistors of the DICE element are in an ON state, wherein, with regard to the input-output state of the DICE element at this time, the gate input in the p-type transistor and the drain output in the n-type transistor is in the Low (0) state, and the gate input in the n-type transistor and the drain output in the p-type transistor is in the High (1) state. Thus, the four DICE elements connected to each other in a loop configuration alternately have the isolated state and the latch state, specifically the isolated state of DICE element 1, the latch state of DICE element 2, the isolated state of DICE element 3, and the latch state of DICE element 4, or the latch state of DICE element 1, the isolated state of DICE element 2, the latch state of DICE element 3, and the isolated state of DICE element 4, respectively, i.e., any adjacent ones of the DICE elements have different states, so that the DICE circuit as a whole can stably retain one logical state. The states are shown in the upper table in FIG. 26.

The principle of the SEU tolerance of the conventional DICE circuit will be described below. FIG. 27 is an explanatory diagram of the principle of the SEU tolerance of the conventional DICE circuit. In the conventional DICE circuit, the DICE element in the latch state and the DICE element in the isolated state are arranged in an alternate manner, so that a logic between nodes is continued without contradiction, and thereby data can be stably retained. Here, in the DICE element in the isolated state (OFF state), there are two OFF-state transistors. These OFF-state transistors can be easily inverted to the ON state, due to external factors such as incidence of energetic particles. However, even when one or two OFF-state transistors of the same DICE element in the isolated state (e.g., DICE element 2) are inverted to the ON state, they are returned to the original state (complemented) by the nodes of two latch-state (ON-state) DICE elements on both sides of the isolated-state DICE element (e.g., DICE element 1 and DICE element 3). Thus, the entire DICE circuit can be maintained in a normal state, without the occurrence of inversion of stored data (the occurrence of SEU).

A specific operation will be described on the assumption that the DICE elements 1 to 4 are, respectively, in the following states: the ON state (latch state)-the OFF state (isolated state)-the ON state (latch state)-the OFF state (isolated state). Further, assume that, while the p-type transistor and the n-type transistor of the DICE element 2 are in the OFF state, one or both of the transistors are inverted from the OFF state to the ON state, due to incidence of energetic articles thereinto. In this case, although the DICE element 2 is erroneously switched from the OFF state to the ON state for a moment, proper data is input to the DICE element 2 from the DICE element 1 and the DICE element 3 on both sides of the DICE element 2, so that immediately after an influence of incidence of energetic particles disappears, the DICE element 2 is returned to normal operation and set to the OFF state. In this way, the conventional DICE circuit prevents the occurrence of SEU.

CITATION LIST

Parent Document

Patent Document 1: U.S. Pat. No. 6,696,873B
Patent Document 2: U.S. Pat. No. 6,327,176B Patent Document 3: US 2004/0017237A
Patent Document 4: U.S. Pat. No. 6,696,874B Non-Patent Document Non-Patent Document 1: T. Calin, M. Nicolaidis, R. Velazco, Upset Hardened Memory Design for Submicron CMOS Technology, IEEE TRANSACTIONS ON NUCLEAR SCIENCE, IEEE, December, 1996, Vol. 43, Issue 6, pp 2874-2878

SUMMARY OF INVENTION

Technical Problem

However, in the conventional DICE circuit, when there is the incidence of energetic particle under a specific condition, SEU can occur. Inversion of stored data of the DICE circuit (SEU) occurs when total two or more OFF-state transistors in and across different DICE elements (e.g., DICE element 2 and DICE element 4) are simultaneously inverted to the ON state. Specifically, when one or more of the OFF-state transistors in each of the two OFF-state DICE elements (e.g., DICE element 2 and DICE element 4) on both sides of one (e.g., DICE element 3) of the ON-state DICE elements are inverted due to incidence of energetic particles, and thereby improper data in the two OFF-state DICE elements are given to the ON-state DICE element (e.g., DICE element 3), the data complement does not work, and thereby SEU occurs in the DICE circuit.

FIG. 28 is an explanatory diagram of a mechanism by which SEU occurs in the conventional DICE circuit. This figure shows a case where the DICE element 2 and the DICE element 4 simultaneously undergo incidence of energetic particles. Such a situation can occur when different energetic particles simultaneously enter the DICE element 2 and the DICE element 4, respectively, or can occur when one energetic particle penetrates a region of the DICE element 2 and the DICE element 4 in a board. Thus, in the conventional DICE circuit, there is a possibility that, depending on the intensity and direction of incidence of energetic particles, two transistors (hereinafter referred to as "critical transistor pair") are simultaneously inverted from the OFF state to the ON state. In this case, the logical state of the DICE circuit is inverted, resulting in the occurrence of SEU. As above, the conventional DICE circuit is likely vulnerable to sufficiently prevent SEU.

FIG. 29 is a diagram showing the critical transistor pair of the conventional DICE circuit. A DICE circuit shown in the left diagram in FIG. 29 comprises eight transistors consisting of a p-type transistor P1, an n-type transistor N1, a p-type transistor P2, an n-type transistor N2, a p-type transistor P3, an n-type transistor N3, a p-type transistor P4, and an n-type transistor N4, wherein eight combinations (each designated by "SEU" written in an intersecting field between two transistors) shown in the right two tables in FIG. 29 shows the combinations of critical transistor pairs. When any one of the critical transistor pairs are simultaneously turns on due to incidence of energetic particles, the logical state of the DICE circuit is inverted. As above, the conventional DICE circuit potentially has vulnerability to SEU.

Solution to Technical Problem

The present invention has been made in view of the above problem, and an object thereof is to provide a highly SEU-tolerant latch circuit and flip-flop circuit by means of redundancy based on duplication of a DICE circuit.

According to a first aspect of the present invention, there is provided a single event upset-tolerant latch circuit configured such that three transistors for redundancy are added to each of eight transistors constituting the conventional DICE latch circuit, at respective positions consisting of a serial position, a parallel position and a parallel-serial position so as to form a four-transistor circuit in which a serially duplicated circuit is duplicated in parallel.

Preferably, in the single event upset-tolerant latch circuit of the present invention, each of the first, second, third and fourth redundant DICE elements is configured such that a connection with a positive power supply or a negative power supply is controlled by control of a clock having a phase reverse to that of the clock for controlling the first and second data input parts.

Preferably, in the single event upset-tolerant latch circuit of the present invention, with regard to fourteen combinations of three critical transistors whose simultaneous inversion can cause single event upset, at least two of three transistors in the same combination are arranged on a vertical or horizontal straight line at a given inter-gate distance in a circuit layout thereof.

Preferably, the single event upset-tolerant latch circuit of the present invention has a circuit layout in which: circuits of the redundant first DICE element and the redundant fourth DICE element are arranged one-above-the-other; circuits of the redundant third DICE element and the redundant second DICE element are arranged one-above-the-other; and a circuit other than the circuits of the redundant first DICE element, the redundant second DICE element, the redundant third DICE element and the redundant fourth DICE element is disposed between a set of the redundant first DICE element and the redundant fourth DICE element arranged one-above-the-other and a set of the redundant third DICE element and the redundant second DICE element arranged one-above-the-other.

Preferably, in the single event upset-tolerant latch circuit of the present invention, the redundant first data input part comprises two transmission gates, and the redundant second data input part comprises two transmission gates.

The single event upset-tolerant latch circuit of the present invention may be configured to add eight transistors for redundancy to each of the eight transistors constituting the DICE element, at respective positions so as to form an nine-transistor circuit in which a serially triplicated circuit is triplicated in parallel, and to accept an input from the same data source through three transmission gates.

The single event upset-tolerant latch circuit of the present invention may be configured to add ($k^2-1$) transistors for redundancy to at respective positions so as to form a $k^2$-transistor circuit in which a serially k-plicated circuit is k-plicated in parallel, and to accept an input from the same data source through k transmission gates.

According to a second aspect of the present invention, there is provided a single event upset-tolerant flip-flop circuit which comprises a front-stage master part and a rear-stage slave part each using the above single event upset-tolerant latch circuit, wherein an output of the single event upset-tolerant latch circuit in the master part is connected to an input of the single event upset-tolerant latch circuit in the slave part, and a clock having a phase reverse to that of a clock to be input to the single event upset-tolerant latch circuit in the master part is input to the single event upset-tolerant latch circuit in the slave part.

Effect of Invention

In the single event upset-tolerant latch circuit of the present invention, three transistors for redundancy are added to each of the eight transistors constituting the DICE latch circuit at respective positions consisting of a serial position, a parallel position and a parallel-serial position so as to form a four-transistor circuit in which a serially duplicated circuit is duplicated in parallel, and each of the first data input part and the second data input part is made dually redundant. This provides an advantageous effect of exhibiting SEU tolerance more immune than the conventional DICE latch circuit.

Preferably, in the single event upset-tolerant latch circuit of the present invention, each of the redundant first, second, third and fourth DICE elements is configured such that a connection with a positive power supply or a negative power supply is controlled by control of a clock having a phase reverse to that of the clock for controlling the first and second data input parts. This provides an advantageous effect of being able to reliably store data from the data input part by control of the clock.

Preferably, in the single event upset-tolerant latch circuit of the present invention, with regard to fourteen combinations of three critical transistors whose simultaneous inversion can cause single event upset, at least two of three transistors in the same combination are arranged on a vertical or horizontal straight line at a given inter-gate distance in a circuit layout thereof. This provides an advantageous effect of being able to increase the area of an opening of a rectangular having apexes at the three critical transistors, so as to reduce the possibility that the three critical transistors are simultaneously inverted due to incidence of energetic particles, resulting in the occurrence of SEU.

Preferably, the single event upset-tolerant latch circuit of the present invention has a circuit layout in which: circuits of the redundant first DICE element and the redundant fourth DICE element are arranged one-above-the-other; circuits of the redundant third DICE element and the redundant second DICE element are arranged one-above-the-other; and a circuit other than the circuits of the redundant first DICE element, the redundant second DICE element, the redundant third DICE element and the redundant fourth DICE element is disposed between a set of the redundant first DICE element and the redundant fourth DICE element arranged one-above-the-other and a set of the redundant third DICE element and the redundant second DICE element arranged one-above-the-other. This provides an advantageous effect of being able to increase the area of an opening of a rectangular having apexes at the three critical transistors so as to reduce the possibility that the three critical transistors are simultaneously inverted due to incidence of energetic particles resulting in the occurrence of SEU.

Preferably, in the single event upset-tolerant latch circuit of the present invention, the redundant first data input part comprises two transmission gates, and the redundant second data input part comprises two transmission gates. This provides an advantageous effect of being able to ensure redundancy in terms of data input, thereby further reducing the possibility of the occurrence of SEU.

The single event upset-tolerant latch circuit of the present invention may be configured to add eight transistors for redundancy to each of the eight transistors constituting the DICE element, at respective positions so as to form an nine-transistor circuit in which a serially triplicated circuit is triplicated in parallel, and to accept an input from the same data source through three transmission gates. In this case, the number of transistors forming the critical combination (transistors whose inversion can cause the occurrence of SEU) is increased. This provides an advantageous effect of being able to obtain more excellent SEU tolerance.

The single event upset-tolerant latch circuit of the present invention may be configured to add $(k^2-1)$ transistors for redundancy to at respective positions so as to form a $k^2$-transistor circuit in which a serially k-plicated circuit is k-plicated in parallel, and to accept an input from the same data source through k transmission gates. In this case, the number of transistors forming the critical combination (transistors whose inversion can cause the occurrence of SEU) is further increased. This provides an advantageous effect of being able to obtain further excellent SEU tolerance.

The single event upset-tolerant flip-flop circuit of the present invention comprises a front-stage master part and a rear-stage slave part each using the above single event upset-tolerant latch circuit, wherein an output of the single event upset-tolerant latch circuit in the master part is connected to an input of the single event upset-tolerant latch circuit in the slave part, and a clock having a phase reverse to that of a clock to be input to the single event upset-tolerant latch circuit in the master part is input to the single event upset-tolerant latch circuit in the slave part. This provides an advantageous effect of being able to construct a single event upset-tolerant flip-flop circuit exhibiting SEU tolerance more excellent than the conventional DICE latch circuit.

BRIEF DESCRIPTION OF DRAWINGS

FIG. 4 is an explanatory diagram of the operation of the HyperDICE memory part.

FIG. 9A is an explanatory diagram showing the principle of SEU tolerance of the HyperDICE latch circuit (HDL), particularly, a normal operation of the HyperDICE latch circuit (HDL).

FIG. 9C is an explanatory diagram showing the principle of SEU tolerance of the HyperDICE latch circuit (HDL), in a situation where the occurrence of SEU can be prevented.

FIG. 11 is an explanatory diagram of critical transistors.

FIG. 14 is a table showing a plurality of combinations of critical tri-transistors which should never be simultaneously inverted.

FIG. 18A is a circuit diagram of a k-plicated HyperDICE element (kHDE) (where k is an integer of 4 or more).

FIG. 29 is a diagram showing the critical transistor pair of the conventional DICE circuit.

DESCRIPTION OF EMBODIMENTS

Reference Signs of Signals or the Like

In advance of the following description, the list of reference signs of signals or the like used in this specification will be shown below:
CK (CKX): clock signal;
CKB (CKBX): inversion clock signal;
D: input data signal;
MO: intermediate output signal to be output from a master to a slave within a flip-flop circuit;
Q: output data signal;
QB: inverted output signal;
$V_{DD}$: power-supply voltage from a positive power supply; and
$V_{SS}$: power-supply voltage from a negative power supply (typically, ground potential of 0 V).

(HyperDICE Element)

Figure 1:
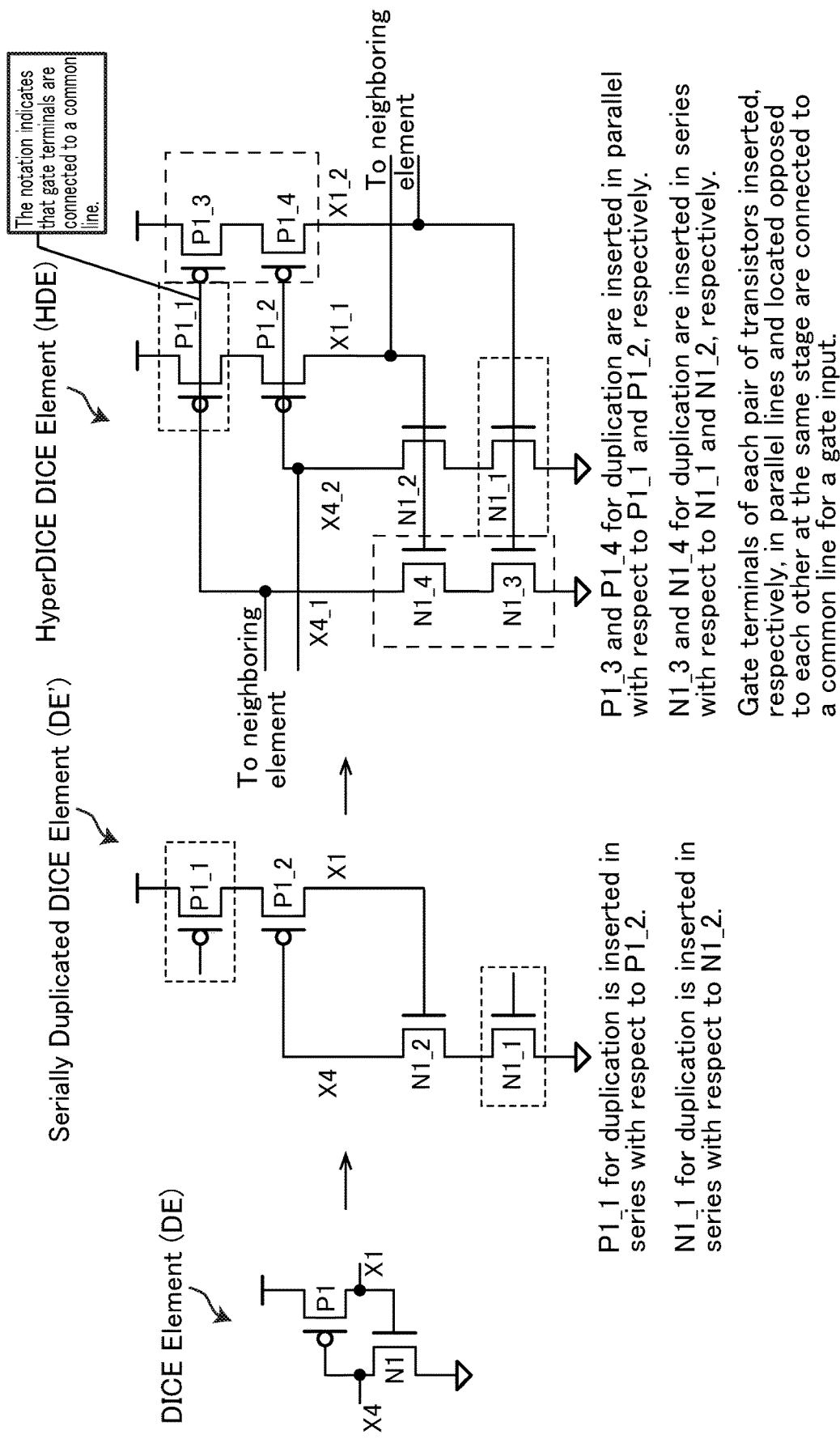
FIG. 1 is an explanatory diagram showing the principle of redundancy based on serial and parallel duplication of a DICE element (DE).

With a view to solving the vulnerability of the conventional DICE circuit to SEU, the present invention is intended to provide a DICE circuit made redundant. FIG. 1 is an explanatory diagram showing the principle of redundancy based on serial and parallel duplication of a DICE element (DE). At the left end of the figure, a conventional DICE element (DE) is described. The conventional DICE element (DE) is composed of a p-type transistor P1 and an n-type transistor N1, wherein a gate terminal in each one of the p-type and n-type transistors and a drain terminal in the other are mutually connected, and wherein the gate terminal of the p-type transistor P1 and the drain terminal of the n-type transistor N1 are connected to form a node X4, and the gate terminal of the n-type transistor N1 and the drain terminal of the p-type transistor P1 are connected to form a node X1. As shown in the central region of FIG. 1, first of all, a transistor having the same conductive type is connected in series to each of the p-type transistor P1 and the n-type transistor N1 of the above conventional DICE element (DE) to serially duplicate each of the p-type transistor P1 and the n-type transistor N1. Specifically, a duplicating p-type transistor P1_1 is inserted in series with respect to a p-type transistor P1_2, and a duplicating n-type transistor N1_1 is inserted in series with respect to an n-type transistor N1_2. In this way, the p-type transistor P1 and the n-type transistor N1 in the conventional DICE circuit (DE) are replaced, respectively, with: the p-type transistor P1_1 and the p-type transistor P1_2; and the n-type transistor N1_1 and the n-type transistor N1_2, so that a serially duplicated DICE element (DE') is obtained.

Then, the serially duplicated transistor circuit of the serially duplicated DICE element (DE') is duplicated in parallel. Specifically, as shown at the right end of FIG. 1, a duplicating p-type transistor P1_3 and a duplicating p-type transistor P1_4 are inserted in parallel with respect to the p-type transistor P1_1 and the p-type transistor P1_2, respectively, and a duplicating n-type transistor N1_3 and a duplicating n-type transistor N1_4 are inserted in parallel with respect to the n-type transistor N1_1 and the n-type transistor N1_2, respectively. In this case, with regard to gate input, gate terminals of each pair of transistors inserted, respectively, in parallel lines and located opposed to each other at the same stage are connected to a common line. Gate terminals of the p-type transistor P1_1 and the p-type transistor P1_3 and a drain terminal of the n-type transistor N1_4 are connected to form a node X4_1, and gate terminals of the p-type transistor P1_2 and the p-type transistor P1_4 and a drain terminal of the n-type transistor N1_2 are connected to form a node X4_2. Further, gate terminals of the n-type transistor N1_2 and the n-type transistor N1_4 and a drain terminal of the p-type transistor P1_2 are connected to form a node X1_1, and gate terminals of the n-type transistor N1_1 and the n-type transistor N1_3 and a drain terminal of the p-type transistor P1_4 are connected to form a node X1_2. In this way, the p-type transistor P1 and the n-type transistor N1 in the conventional DICE circuit (DE) are replaced, respectively, with: the p-type transistor P1_1, the p-type transistor P1_2, the p-type transistor P1_3; and the p-type transistor P1_4, and a set of the n-type transistor N1_1, the n-type transistor N1_2, the n-type transistor N1_3 and the n-type transistor N1_4. Further, the node X1 and the node X4 are replaced, respectively, with: the node X1_1 and the node X1_2; and the node X4_1 and the node X4_2.

In this specification, a redundant circuit obtained by serially duplicating each transistor in the conventional DICE circuit and further parallel duplicating the resulting circuit in the above manner will hereinafter be referred to as "Hyper-DICE element (HDE)". That is, the HyperDICE element (HDE) is a redundant DICE element comprised of total eight transistors consisting of four p-type transistors and four n-type transistors, wherein each set of the four p-type transistors and the four n-type transistors is configured such that three transistors for redundancy are added to a transistor subject to redundancy (primary transistor) at respective positions consisting of a serial position, a parallel position and a parallel-serial position so as to form a four-transistor circuit in which a serially duplicated circuit is duplicated in parallel. In the above description, a serially duplicated circuit is obtained and then duplicated in parallel. Alternatively, a parallel duplicated circuit may be obtained and then duplicated in series to obtain the same result. In FIG. 1, the symbol of single conductive wire passes through portions representing gate terminals in the symbols of the two transistors duplicated in parallel. This indicates that these gate terminals are connected to a common conductive wire (i.e., the two gate terminals are connected in parallel to a common conductive wire).

Figure 2:
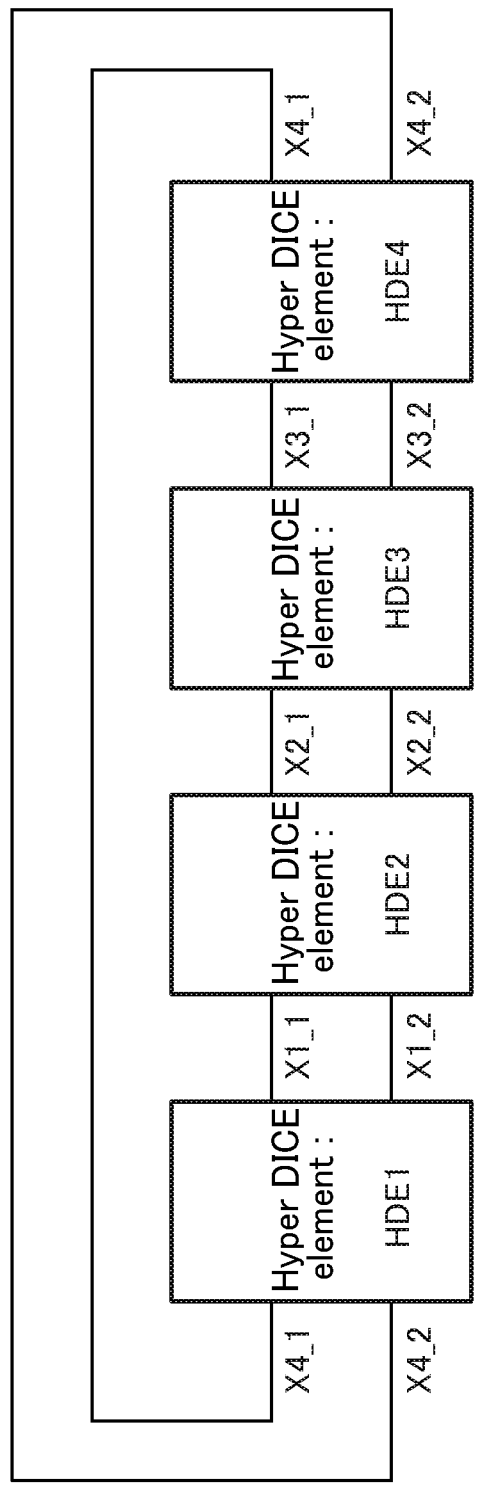
FIG. 2 is a block diagram of a HyperDICE memory part comprised of HyperDICE elements.

FIG. 2 is a block diagram of a HyperDICE memory part comprised of HyperDICE elements. The HyperDICE memory part (HDM) is obtained by connecting four Hyper-DICE elements (HDEs) 1, 2, 3, 4 in a loop configuration. Each of the HyperDICE elements has four connection points (nodes). Nodes X4_1, X4_2, X1_1, X1_2 of the HyperDICE element (HDE) 1 are shared by and connected to nodes X4_1, X4_2 of the HyperDICE element (HDE) 4 and nodes X1_1, X1_2 of the HyperDICE element (HDE) 2, respectively. Similarly, nodes X1_1, X1_2, X2_1, X2_2 of the HyperDICE element (HDE) 2 are shared by and connected to the nodes X1_1, X1_2 of the HyperDICE element (HDE) 1 and nodes X2_1, X2_2 of the HyperDICE element (HDE) 3, respectively. Similarly, nodes X2_1, X2_2, X3_1, X3_2 of the HyperDICE element (HDE) 3 are shared by and connected to the nodes X2_1, X2_2 of the HyperDICE element (HDE) 2 and nodes X3_1, X3_2 of the HyperDICE element (HDE) 4, respectively. Similarly, the nodes X3_1, X3_2, X4_1, X4_2 of the HyperDICE element (HDE) 4 are shared by and connected to the nodes X3_1, X3_2 of the HyperDICE element (HDE) 3 and the nodes X4_1, X4_2 of the HyperDICE element (HDE) 1, respectively.

Figure 3:
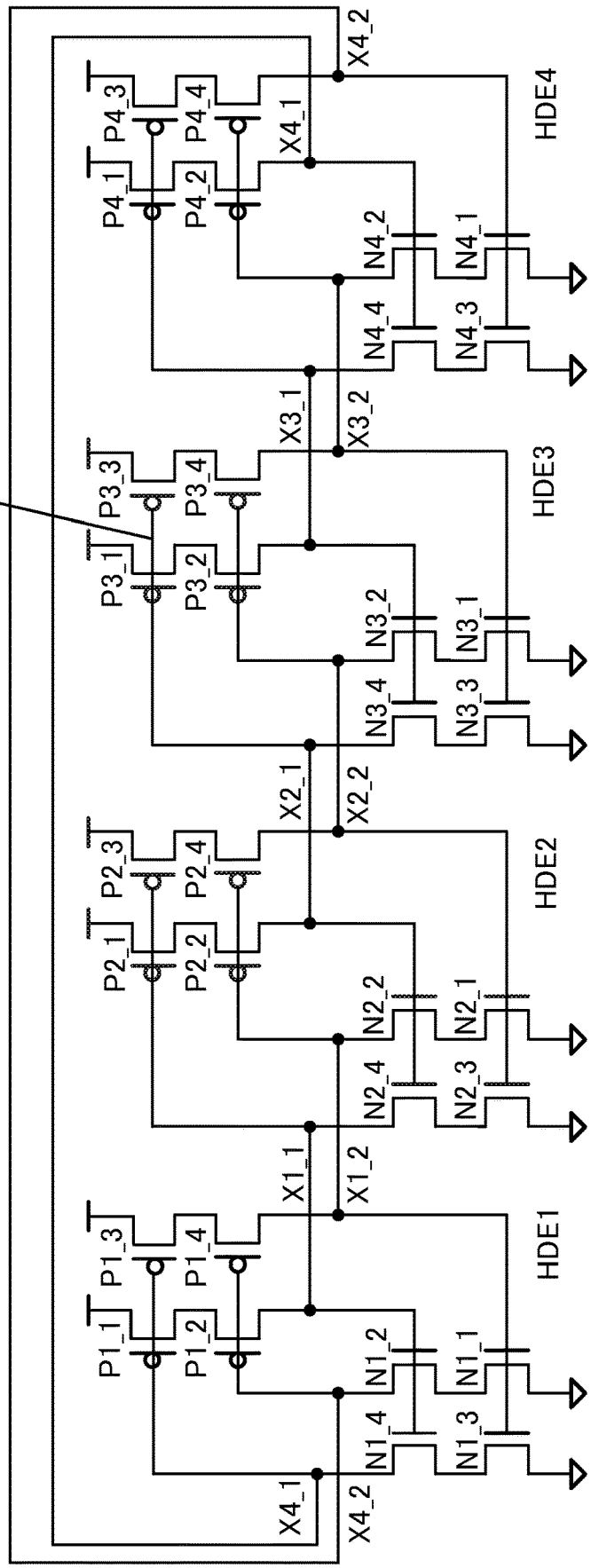
FIG. 3 is a circuit diagram of the HyperDICE memory part (HDM).

FIG. 3 is a transistor-level circuit diagram of the Hyper-DICE memory part (HDM). That is, FIG. 3 is formed by applying the transistor-level circuit of the HyperDICE element (HDE) shown on the right side of FIG. 1 to the symbols (blocks) of the HyperDICE elements (HDEs) 1 to 4. This is a basic part of a HyperDICE latch circuit (HDL), and functions as a memory section for retaining data input from the outside.

FIG. 4 is an explanatory diagram of the operation of the HyperDICE memory part. A lower left diagram in FIG. 4 shows the operation of the HyperDICE element (HDE) 1 during an isolated state in which, with regard to an input-output state, gate input in the p-type transistors and drain output in the n-type transistors are in a 1 (High) state, and gate input in the n-type transistors and drain output in the p-type transistors are in a 0 (Low) state. A lower right diagram in FIG. 4 shows the operation of the HyperDICE element (HDE) 1 during a latch state in which, with regard to the input-output state, the gate input in the p-type transistors and the drain output in the n-type transistors are in the 0 (Low) state, and the gate input in the n-type transistors and the drain output in the p-type transistors are in the 1 (High) state. An upper table in FIG. 3 shows a logical state in each of the HyperDICE elements (HDEs) 1 to 4. In the four HyperDICE elements connected in a loop configuration, two HyperDICE elements set in different states are alternately arranged, so that the DICE circuit as a whole can stably retain one logical state. In this way, the HyperDICE memory part is operable to store two types of logical states. Further, operation for inputting a logical state to the HyperDICE memory part may be performed by inputting the same logical state to the HyperDICE element (HDE) 1 and the HyperDICE element (HDE) 3, or by inputting the same logical state to the HyperDICE element (HDE) 2 and the HyperDICE element (HDE) 4.

(HyperDICE Latch Circuit)

Figure 5:
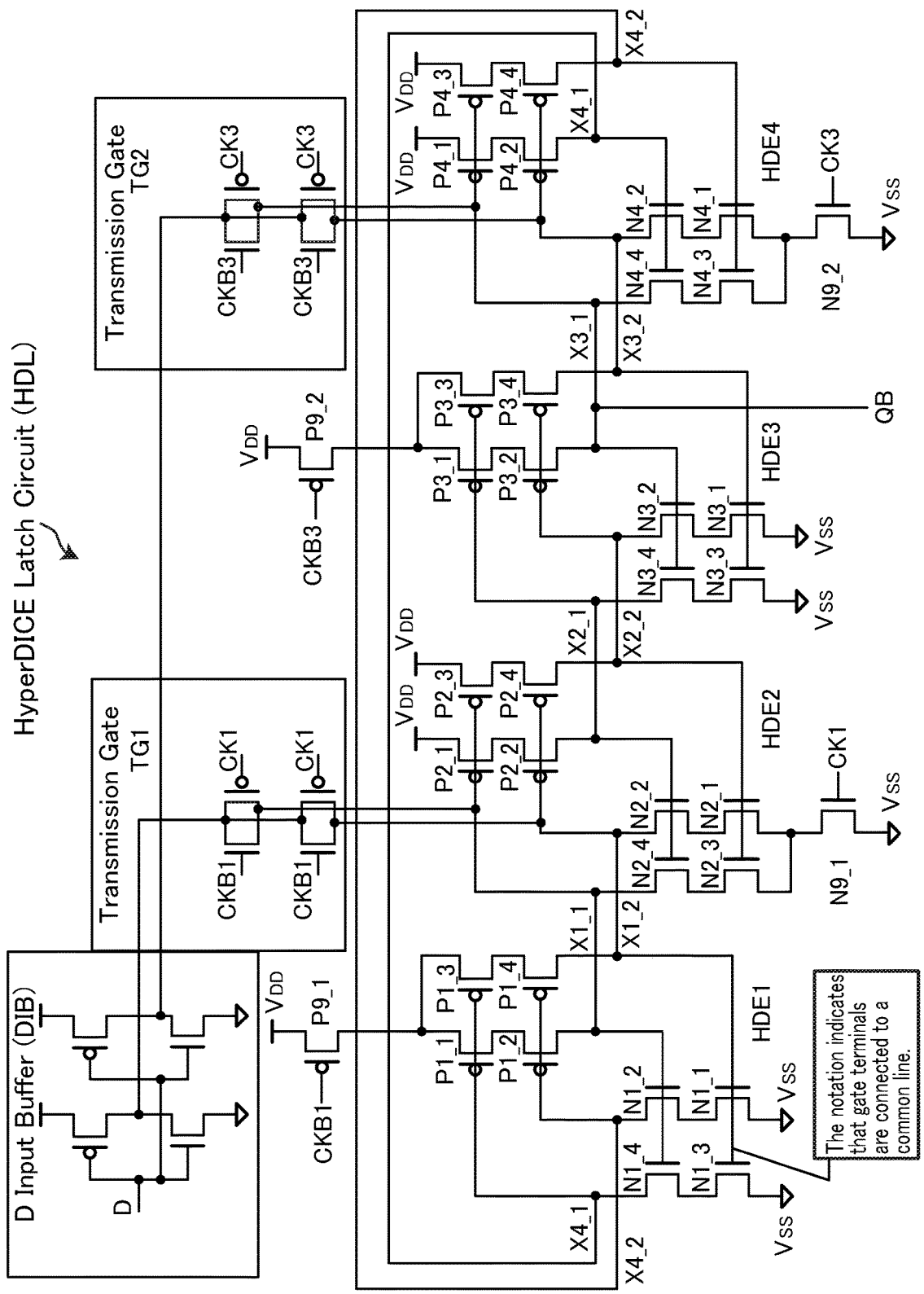
FIG. 5 is a circuit diagram of a HyperDICE latch circuit (HDL).

FIG. 5 is a circuit diagram of a HyperDICE latch circuit (HDL). FIG. 5 shows a HyperDICE latch circuit (HDL) constructed by adding data input parts and others to the HyperDICE memory part (HDM) shown in FIG. 4. The HyperDICE latch circuit (HDL) is obtained by adding the following circuit elements to the HyperDICE memory part (HDM):

a p-type transistor (P9_1) connected to a positive power supply ($V_{DD}$) side of the HyperDICE element (HDE) 1 and configured to be controlled by a clock signal CKB1 (such that it is turned on when the clock signal CKB1 is 0, and turned off when the clock signal CKB1 is 1);

an n-type transistor (N9_1) connected to a negative power supply ($V_{SS}$) side of the HyperDICE element (HDE) 2 and configured to be controlled by a clock signal CK1 (such that it is turned on when the clock signal CK1 is 1, and turned off when the clock signal CK1 is 0);

a p-type transistor (P9_2) connected to the positive power supply ($V_{DD}$) side of the HyperDICE element (HDE) 3 and configured to be controlled by a clock signal CKB3 (such that it is turned on when the clock signal CKB3 is 0, and turned off when the clock signal CKB3 is 1);

an n-type transistor (N9_2) connected to the negative power supply ($V_{SS}$) side of the HyperDICE element (HDE) 4 and configured to be controlled by a clock signal CK3 (such that it is turned on when the clock signal CK3 is 1, and turned off when the clock signal CK3 is 0);

two transmission gates (TG1) (which are equivalent to "first data input part" set forth in the appended claims) whose upstream sides are connected to a common line on an upstream side thereof and whose downstream sides are connected, respectively to downstream sides of the node X1_1 and the node X1_2 shared by the HyperDICE element (HDE) 1 and the HyperDICE element (HDE) 2, and configured to be controlled by the clock signal CKB1 and the clock signal CK1 having a phase reverse to that of the clock signal CKB1 (such that it is turned off when the clock signal CKB1 is 0, and turned on when the clock signal CKB1 is 1);

two transmission gates (TG2) (which are equivalent to "second data input part" set forth in the appended claims) whose upstream sides are connected to a common line and whose downstream sides are connected, respectively to downstream sides of the node X3_1 and the node X3_2 shared by the HyperDICE element (HDE) 3 and the HyperDICE element (HDE) 4, and configured to be controlled by the clock signal CKB3 and the clock signal CK3 having a phase reverse to that of the clock signal CKB3 (such that it is turned off when the clock signal CKB3 is 0, and turned on when the clock signal CKB3 is 1); and a D input buffer (DIB) comprised of two inverters whose upstream sides are connected to a common line and whose downstream sides are connected, respectively, to upstream sides of the transmission gates (TG1) and the Transmission gates (TG2).

In HyperDICE latch circuit (HDL) in FIG. 5, a data output part is connected to the node X3_1 to obtain an inverted data output QB. It should be noted here that data output or inverted data output may be obtained from any of the nodes.

(Configuration of HyperDICE Latch Circuit)

This HyperDICE latch circuit (HDL) forms a single event upset-tolerant latch circuit having an SEU tolerance more excellent than the conventional DICE circuit. The configuration of the HyperDICE latch circuit (HDL) will be described below, using terms distinguished from each other by assigning ordinal numbers to each circuit element name. A basis circuit of the HyperDICE latch circuit (HDL) is configured such that four Dual Interlocked Storage Cell (DICE) elements are connected in series and in a loop configuration, wherein: each of the DICE elements is comprised of a p-type transistor and an n-type transistor, wherein a gate terminal in each one of the p-type and n-type transistors and a drain terminal in the other are mutually connected; and wherein each of the DICE elements has a first node interconnecting between the gate terminal of the p-type transistor and the drain terminal of the n-type transistor, and a second node interconnecting between the drain terminal of the p-type transistor and the gate terminal of the n-type transistor. The basis circuit comprises: a first DICE element comprised of a first p-type transistor (P1_1) and a first n-type transistor (N1_1), wherein a gate terminal in each one of the first p-type and n-type transistors and a drain terminal in the other are mutually connected; a second DICE element comprised of a second p-type transistor (P2_1) and a second n-type transistor (N2_1), wherein a gate terminal in each one of the second p-type and n-type transistors and a drain terminal in the other are mutually connected; a third DICE element comprised of a third p-type transistor (P3_1) and a third n-type transistor (N3_1), wherein a gate terminal in each one of the third p-type and n-type transistors and a drain terminal in the other are mutually connected; and a fourth DICE element comprised of a fourth p-type transistor (P4_1) and a fourth n-type transistor (N4_1), wherein a gate terminal in each one of the fourth p-type and n-type transistors and a drain terminal in the other are mutually connected; wherein: a node interconnecting between a gate terminal of a p-type transistor comprised in the first DICE element and a drain terminal of an n-type transistor comprised in the first DICE element forms a first DICE element's first node; a node interconnecting between a gate terminal of a p-type transistor comprised in the second DICE element and a drain terminal of an n-type transistor comprised in the second DICE element forms a second DICE element's first node; a node interconnecting between a gate terminal of a p-type transistor comprised in the third DICE element and a drain terminal of an n-type transistor comprised in the third DICE element forms a third DICE element's first node; a node interconnecting between a gate terminal of a p-type transistor comprised in the fourth DICE element and a drain terminal of an n-type transistor comprised in the fourth DICE element forms a fourth DICE element's first node; a node interconnecting between a drain terminal of a p-type transistor comprised in the first DICE element and a gate terminal of an n-type transistor comprised in the first DICE element forms a first DICE element's second node; a node interconnecting between a drain terminal of a p-type transistor comprised in the second DICE element and a gate terminal of an n-type transistor comprised in the second DICE element forms a second DICE element's second node; a node interconnecting between a drain terminal of a p-type transistor comprised in the third DICE element and a gate terminal of an n-type transistor comprised in the third DICE element forms a third DICE element's second node; and a node interconnecting between a drain terminal of a p-type transistor comprised in the fourth DICE element and a gate terminal of an n-type transistor comprised in the fourth DICE element forms a fourth DICE element's second node; and wherein: the first DICE element's first node is connected to the fourth DICE element's second node; the second DICE element's first node is connected to the first DICE element's second node; the third DICE element's first node is connected to the second DICE element's second node; and the fourth DICE element's first node is connected to the third DICE element's second node; and wherein: the second DICE element's first node and the fourth DICE element's first node are connected, respectively, to a first data input part and a second data input part each configured such that a conduction state thereof is controlled by control of a clock; and at least one of the first DICE element's second node, the second DICE element's second node, the third DICE element's second node and the fourth DICE element's second node is connected to a data output part; and wherein: each of the first p-type transistor (P1_1), the first n-type transistor (N1_1), the second p-type transistor (P2_1), the second n-type transistor (N2_1), the third p-type transistor (P3_1), the third n-type transistor (N3_1), the fourth p-type transistor (P4_1) and the fourth n-type transistor (N4_1) is configured such that three transistors for redundancy are added thereto at respective positions consisting of a serial position, a parallel position and a parallel-serial position so as to form a four-transistor circuit in which a serially duplicated circuit is duplicated in parallel; and each of the first data input part and the second data input part is made dually redundant.

With regard to a power supply for the DC elements of the HyperDICE latch circuit (HDL), each of the redundant first, second, third and fourth DICE elements is configured such that a connection with a positive power supply ($V_{DD}$) or a negative power supply ($V_{SS}$) controlled by control of a clock having a phase reverse to that of the clock for controlling the first and second data input parts.

With regard to the arrangement of the transistors in each of the redundant first to fourth DICE elements of the HyperDICE latch circuit (HDL), the transistor subject to redundancy and the parallel-duplicating transistor are configured such that gate terminals thereof are connected to a common line; the serially-duplicating transistor and the parallel-serially-duplicating transistor are configured such that gate terminals thereof are connected to a common line; the transistor subject to redundancy and the serially-duplicating transistor are connected in series; and the parallel-duplicating transistor and the parallel-serially-duplicating transistor are connected in series.

With respect to a specific arrangement of the transistors in the redundant first to fourth DICE elements of the Hyper-DICE latch circuit (HDL), the serial, parallel and parallel-serial duplications are implemented by: connecting first to fourth serially-duplicating p-type transistors (P1_2, P2_2, P3_2, P4_2) in series, respectively, to negative power supply ($V_{SS}$) sides of the first to fourth p-type transistors (P1_1, P2_1, P3_1, P4_1) each constituting a respective one of the first to fourth DICE elements, and connecting four serially-duplicating n-type transistors (N1_2, N2_2, N3_2, N4_2) in series, respectively, to positive power supply ($V_{DD}$) sides of the four n-type transistors (N1_1, N2_1, N3_1, N4_1) each constituting a respective one of the redundant first to fourth DICE elements; connecting first to fourth parallel-duplicating p-type transistors (P1_3, P2_3, P3_3, P4_3) whose gate terminals are connected, respectively, to gate terminals of the first to fourth p-type transistors (P1_1, P2_1, P3_1, P4_1) each constituting a respective one of the redundant first to fourth DICE elements, and first to fourth parallel-serially-duplicating p-type transistors (P1_4, P2_4, P3_4, P4_4) whose gate terminals are connected, respectively, to gate terminals of the first to fourth serially-duplicating p-type transistors (P1_2, P2_2, P3_2, P4_2) each constituting a respective one of the redundant first to fourth DICE elements, in series, said serially connected p-type transistors (P1_3-P1_4, P2_3-P2_4, P3_3-P3_4, P4_3-P4_4) respectively being placed between positive power supply ($V_{DD}$) sides and respective gate terminals of the first to fourth n-type transistors (N1_1, N_1, N3_1, N4_1); and connecting first to fourth parallel-duplicating n-type transistors (N1_3, N2_3, N3_3, N4_3) whose gate terminals are connected, respectively, to gate terminals of the first to fourth n-type transistors (N1_1, N2_1, N3_1, N4_1) each constituting a respective one of the redundant first to fourth DICE elements, and first to fourth parallel-serially-duplicating n-type transistors (N1_4, N2_4, N3_4, N4_4) whose gate terminals are connected, respectively, to gate terminals of the first to fourth serially-duplicating n-type transistors (N1_2, N2_2, N3_2, N4_2) each constituting a respective one of the redundant first to fourth DICE elements, in series, said serially connected n type transistors (N1_3-N1_4, N2_3-N2_4, N3_3-N3_4, N4_3-N4_4) respectively being placed between negative power supply ($V_{SS}$) sides and respective gate terminals of the first to fourth p-type transistors (P1_1, P2_1, P3_1, P4_1).

With respect to a connection relationship of the transistors in each of the redundant first to fourth DICE elements of the HyperDICE latch circuit (HDL), the common line connecting the gate terminals of the serially-duplicating p-type transistor and the parallel-serially-duplicating p-type transistor is connected to a drain terminal side of the serially-duplicating n-type transistor connected in series to the n-type transistor subject to redundancy, to form a duplicated and redundant DICE element's first node, and the common line connecting the gate terminals of the serially-duplicating n-type transistor and the parallel-serially-duplicating n-type transistor is connected to a drain terminal side of the serially-duplicating p-type transistor connected in series to the p-type transistor subjected to redundancy, to form a duplicated and redundant DICE element's second node.

With respect to a specific connection relationship of the transistors in the redundant first to fourth DICE elements of the HyperDICE latch circuit (HDL), a node interconnecting between the gate terminal of the first p-type transistor (P1_1) comprised in the redundant first DICE element and the drain terminal of the first parallel-serially-duplicating n-type transistor (N1_4) comprised in the redundant first DICE element is a redundant first DICE element's first node (X4-1); a node interconnecting between the gate terminal of the second p-type transistor (P2_1) comprised in the redundant second DICE element and the drain terminal of the second parallel-serially-duplicating n-type transistor (N2_4) comprised in the redundant second DICE element is a redundant second DICE element's first node (X1-1), wherein the redundant second DICE element's first node (X1-1) is connected to the redundant first data input part; a node interconnecting between the gate terminal of the third p-type transistor (P3_1) comprised in the redundant third DICE element and the drain terminal of the third parallel-serially-duplicating n-type transistor (N3_4) comprised in the redundant third DICE element is a redundant third DICE element's first node (X2-1); a node interconnecting between the gate terminal of the fourth p-type transistor (P4_1) comprised in the redundant fourth DICE element and the drain terminal of the fourth parallel-serially-duplicating n-type transistor (N4_4) comprised in the redundant fourth DICE element is a redundant fourth DICE element's first node (X3-1), wherein the redundant fourth DICE element's first node (X3-1) is connected to the redundant second data input part; a node interconnecting between the gate terminal of the first serially-duplicating p-type transistor (P1_2) comprised in the redundant first DICE element and the drain terminal of the first serially-duplicating n-type transistor (N1_2) comprised in the redundant first DICE element forms a redundant first DICE element's duplicating first node (X4-2); a node interconnecting between the gate terminal of the second serially-duplicating p-type transistor (P2_2) comprised in the redundant second DICE element and the drain terminal of the second serially-duplicating n-type transistor (N2_2) comprised in the redundant second DICE element forms a redundant second DICE element's duplicating first node (X1-2), wherein the redundant second DICE element's duplicating first node (X1-2) is connected to the redundant first data input part; a node interconnecting between the gate terminal of the third serially-duplicating p-type transistor (P3_2) comprised in the redundant third DICE element and the drain terminal of the third serially-duplicating n-type transistor (N3_2) comprised in the redundant third DICE element forms a redundant third DICE element's duplicating first node (X2-2); a node interconnecting between the gate terminal of the fourth serially-duplicating p-type transistor (P4_2) comprised in the redundant fourth DICE element and the drain terminal of the fourth serially-duplicating n-type transistor (N4_2) comprised in the redundant fourth DICE element forms a redundant fourth DICE element's duplicating first node (X3-2), wherein the redundant fourth DICE element's duplicating first node (X3-2) is connected to the redundant second data input part; a node interconnecting between the drain terminal of the first serially-duplicating p-type transistor (P1_2) comprised in the redundant first DICE element and the gate terminal of the first serially-duplicating n-type transistor (N1_2) comprised in the redundant first DICE element is a redundant first DICE element's second node (X1-1); a node interconnecting between the drain terminal of the second serially-duplicating p-type transistor (P2_2) comprised in the redundant second DICE element and the gate terminal of the second serially-duplicating n-type transistor (N2_2) comprised in the redundant second DICE element is a redundant second DICE element's second node (X2-1); a node interconnecting between the drain terminal of the third serially-duplicating p-type transistor (P3_2) comprised in the redundant third DICE element and the gate terminal of the third serially-duplicating n-type transistor (N3_2) comprised in the redundant third DICE element is a redundant third DICE element's second node (X3-1); a node interconnecting between the drain terminal of the fourth serially-duplicating p-type transistor (P4_2) comprised in the redundant fourth DICE element and the gate terminal of the fourth serially-duplicating n-type transistor (N4_2) comprised in the redundant fourth DICE element is a redundant fourth DICE element's second node (X4-1); a node interconnecting between the drain terminal of the first parallel-serially-duplicating p-type transistor (P1_4) comprised in the redundant first DICE element and the gate terminal of the first n-type transistor (N1_1) comprised in the redundant first DICE element forms a redundant first DICE element's duplicating second node (X1-2); a node interconnecting between the drain terminal of the second parallel-serially-duplicating p-type transistor (P2_4) comprised in the redundant second DICE element and the gate terminal of the second n-type transistor (N2_1) comprised in the redundant second DICE element forms a redundant second DICE element's duplicating second node (X2-2); a node interconnecting between the drain terminal of the third parallel-serially-duplicating p-type transistor (P3_4) comprised in the redundant third DICE element and the gate terminal of the third n-type transistor (N3_1) comprised in the redundant third DICE element forms a redundant third DICE element's duplicating second node (X3-2); and a node interconnecting between the drain terminal of the fourth parallel-serially-duplicating p-type transistor (P4_4) comprised in the redundant fourth DICE element and the gate terminal of the fourth n-type transistor (N4_1) comprised in the redundant fourth DICE element forms a redundant fourth DICE element's duplicating second node (X4-2); wherein: the redundant first DICE element's first node (X4-1) is connected to the redundant fourth DICE element's second node (X4-1); the redundant second DICE element's first node (X1-1) is connected to the redundant first DICE element's second node (X1-1); the redundant third DICE element's first node (X2-1) is connected to the redundant second DICE element's second node (X2-1); the redundant fourth DICE element's first node (X3-1) is connected to the redundant third DICE element's second node (X3-1); the redundant first DICE element's duplicating first node (X4-2) is connected to the redundant fourth DICE element's duplicating second node (X4-2); the redundant second DICE element's duplicating first node (X1-2) is connected to the redundant first DICE element's duplicating second node (X1-2); the redundant third DICE element's duplicating first node (X2-2) is connected to the redundant second DICE element's duplicating second node (X2-2); and the redundant fourth DICE element's duplicating first node (X3-2) is connected to the redundant third DICE element's duplicating second node (X3-2).

With respect to a specific connection relationship between the DICE elements and the data input parts in the HyperDICE latch circuit (HDL), the redundant first data input part comprises two transmission gates, wherein two outputs of the transmission gates are connected, respectively, to the redundant second DICE element's first node, and the redundant second DICE element's duplicating first node. Further, the redundant second data input part comprises two transmission gates, wherein two outputs of the transmission gates are connected, respectively, to the redundant fourth DICE element's first node, and the redundant fourth DICE element's duplicating first node.

(Clock Signal)

A clock signal to be applied to the HyperDICE latch circuit (HDL) will be described below. In this embodiment, two types of clock signals consisting of CK1 (and reverse-phased clock signal CKB 1), and CK3 (and reverse-phased clock signal CKB 3) are applied. Alternatively, the same signals may be applied. Basically, when each of the clock signal CK1 and the clock signal CK3 is in the 0 (Low) state, a corresponding one of the transmission gate TG1 and the transmission gate TG2 is turns on (set to a conduction state) to enable data input therethrough. Further, the p-type transistors P9_1, P9_2 and the n-type transistors N9_1, N9_2 are turned off to turn off electric power to be supplied to the HyperDICE element (HDE) 1 to 4 to allow the logical state of the HyperDICE latch circuit (HDL) to be determined by the data input. On the other hand, when each of the clock signals CK1, CK3 is in the 1 (High) state, a corresponding one of the transmission gates TG1, TG2 is turns off (set to a non-conduction state) to disable data input therethrough. Further, the p-type transistors P9_1, P9_2 and the n-type transistors N9_1, N9_2 are turned on to turn on electric power to be supplied to the HyperDICE element (HDE) 1 to 4 to allow the logical state of the HyperDICE latch circuit (HDL) to be retained.

Here, it is preferable to set a slight difference between the clock signal CK1 (and reverse-phased clock signal CKB 1), and the clock signal CK3 (and reverse-phased clock signal CKB 3), in one clock cycle. Specifically, a falling timing of the clock signal CKB3 having a polarity in which when it is in the High level, the transmission gate TG2 is turned on, is the same as that of the clock signal CKB1 having a polarity in which when it is in the High level, the transmission gate TG1 is turned on. On the other hand, with respect to a rising timing of the clock signal CKB3, a rising edge thereof is delayed such that the rising timing has a given delay time from a rising timing of the clock signal CKB1.

Figure 6:
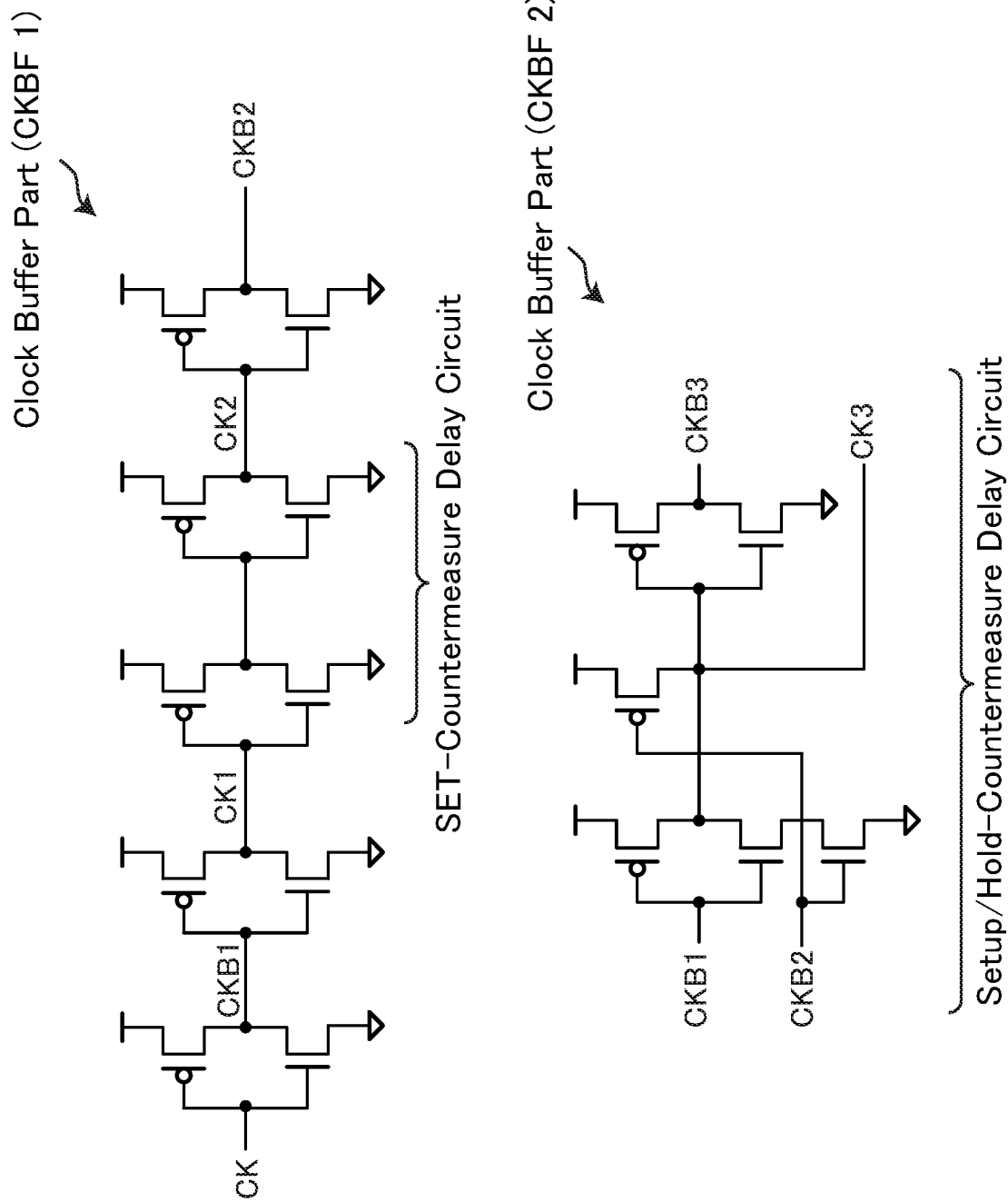
FIG. 6 is a circuit diagram of a circuit for generating two clock signals having a given timing difference.

FIG. 6 is a circuit diagram of a circuit for generating two clock signals having a given timing difference. In order to generate a clock signal CK1 and a clock signal CK3 having such a clock difference, in a clock buffer part CKBF1 shown on the upper side of FIG. 6, a clock signal CK1 and a clock signal CKB1 are generated, and a clock signal CK2 and a clock signal CKB2 each having a timing delayed from a respective one of the clock signal CK1 and the clock signal CKB1, via two serial-connected inverters serving as a SET (Single Event Transient)-countermeasure delay circuit. Then, the clock signal CKB1 and the clock signal CKB2 are input to a setup/hold-countermeasure circuit in a clock buffer part CKBF1 shown on the lower side of FIG. 6, to generate a clock signal CKB3 whose rising timing has a given delay time from a raising timing of the clock signal CKB 1, and a clock signal CK3 whose falling timing has a given delay time from a falling timing of the clock signal CK1.

In this way, a timing difference can be set between the clock signal CK1 (and reverse-phased clock signal CKB 1), and the clock signal CK3 (and reverse-phased clock signal CKB 3). In this case, even if, due to SET (Single Event Transient) on the upstream side, an erroneous input is made in a time period during which, due to the delay, the clock signal CK1 (and reverse-phased clock signal CKB 1) is not coincident with the clock signal CK3 (and reverse-phased clock signal CKB 3) between a portion of the memory section comprised of the DICE elements (HDEs) 1 and 2 to which the clock signal CK1 (and reverse-phased clock signal CKB 1) is applied, and a portion of the memory section comprised of the DICE elements (HDEs) 3 and 4 to which the clock signal CK3 (and reverse-phased clock signal CKB 3) is applied, it is possible to prevent a situation where data changes in both the portions of the memory section due to the erroneous input.

Figures 7, 8:
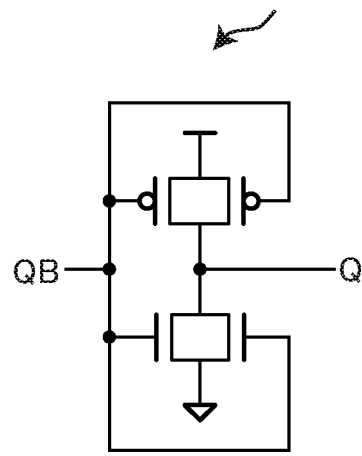
FIG. 7 is a circuit diagram of an output buffer part (OBF).
FIG. 8 is a table of truth values of the HyperDICE latch circuit (HDL).

FIG. 7 is a circuit diagram of an output buffer part (OBF). The output buffer part (OBF) is operable to output, as output data Q, inverted output data QB appearing the data output part. In FIG. 7, the output buffer part (OBF) is constructed as an inverter comprised of two pairs of p-type and n-type transistors. Alternatively, it may be constructed as an inverter comprised of a single pair of p-type and n-type transistors. The number of transistors constituting the inverter should be determined according to drive capability and transistor size.

FIG. 8 is a table of truth values of the HyperDICE latch circuit (HDL). When the clock signal CK (CK1 and CK3) is in the 0 state, the HyperDICE latch circuit (HDL) is in a data-through state, so that the same logic as an input data signal D is output as an output data signal Q. When the clock signal CK (CK1 and CK3) is in the 1 state, the HyperDICE latch circuit (HDL) is in a data-latch state, so that an output data signal Q retaining the last logic is output, irrespective of a logic of the input data signal D.

(Operation of HyperDICE Latch Circuit)

Next, the operation of the HyperDICE latch circuit (HDL) will be described. In the conventional DICE circuit, two transistors of the memory section in an OFF state are simultaneously inverted, data retained in the DICE circuit is also inverted (SEU occurs), whereas, in the HyperDICE latch circuit (HDL), even if two transistors of the memory section in the OFF state are simultaneously inverted, data retained in the HyperDICE latch circuit is not inverted (no SEU occurs). In the HyperDICE latch circuit (HDL), the retained data is not inverted unless three or more transistors in the OFF state are simultaneously inverted.

Figure 9B:
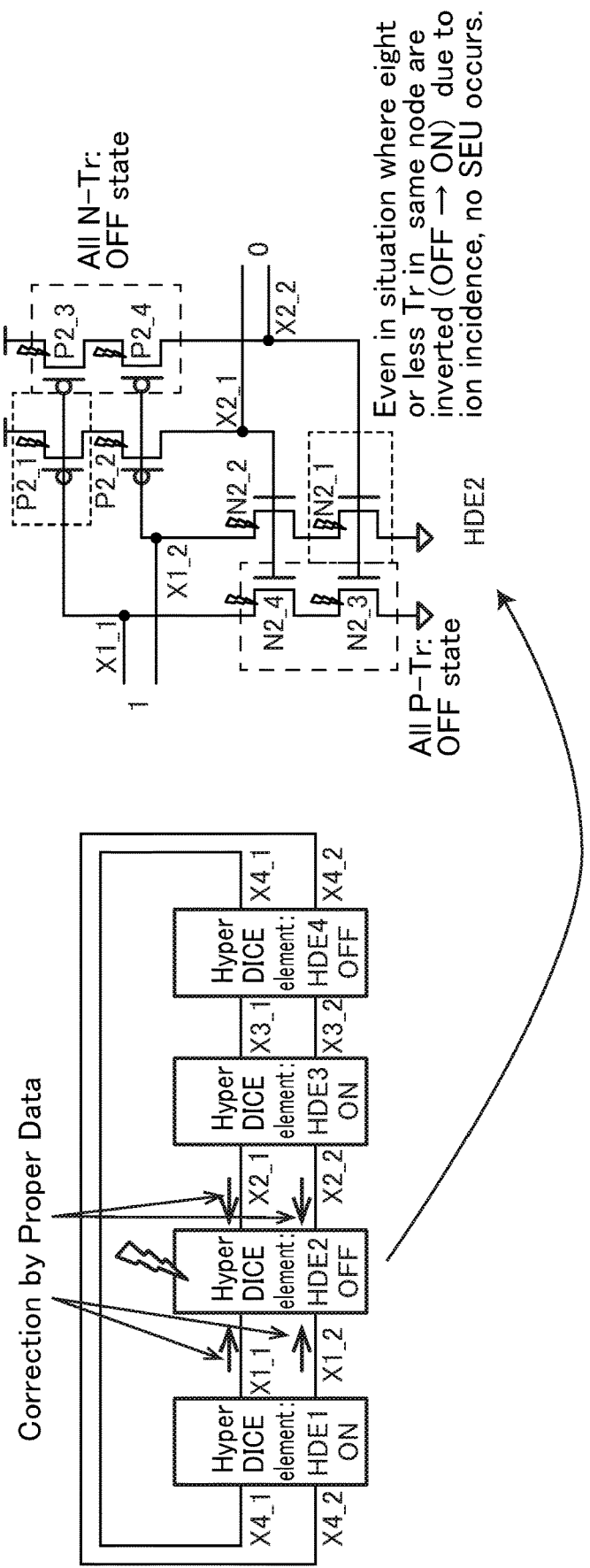
FIG. 9B is an explanatory diagram showing the principle of SEU tolerance of the HyperDICE latch circuit (HDL), in a situation where the occurrence of SEU can be prevented.

FIG. 9A is an explanatory diagram showing the principle of SEU tolerance of the HyperDICE latch circuit (HDL), particularly, a normal operation of the HyperDICE latch circuit (HDL) in a situation where no SEU occurs. In FIG. 9A, the upper table shows two types of logical states (isolated state and latch state) in a situation where the HyperDICE elements (HDEs) 1 to 4 stably retain data. In the HyperDICE latch circuit in the normal state, as with the DICE circuit, the HyperDICE elements (HDEs) 1 to 4 are configured such that the HyperDICE element (HDE) in the latch state and the HyperDICE element (HDE) in the isolated state are arranged alternately, whereby a logic between nodes is continued without contradiction, and thereby data can be stably retained. In FIG. 9A, the lower diagrams show the state of transistors in each of the isolated and latch states of the HyperDICE element (HDE) 1. FIG. 9B is an explanatory diagram showing the principle of SEU tolerance of the HyperDICE latch circuit (HDL), in a situation where the occurrence of SEU can be prevented. FIG. 9B shows the operation of the HyperDICE latch circuit (HDL) when one or more transistors in the same HyperDICE element (e.g., HDE 2) are simultaneously inverted. In the DICE node in the isolated state (OFF state), there Is eight OFF-state transistors. These transistors can be easily inverted to the ON state, due to external factors such as incidence of energetic particles. However, even in a situation where eight or less OFF-state transistors in the same HyperDICE element (e.g., HDE 2) in the isolated state are simultaneously inverted, they are returned to their original state (complemented) by the two latch-state (ON-state) HyperDICE elements (e.g., HDE 1 and HDE 3) on both side of the isolated-state HyperDICE element. Thus, the entire DICE circuit can be maintained in a normal state, without the occurrence of inversion of retained data (the occurrence of SEU). FIG. 9C is an explanatory diagram showing the principle of SEU tolerance of the HyperDICE latch circuit (HDL), in the situation where the occurrence of SEU can be prevented. FIG. 9 is a diagram for explaining one example where even when two OFF-state transistors in and across different DICE elements are simultaneously inverted to the ON state, data retained in the HyperDICE latch circuit is not inverted (no SEU occurs). The inversion of data retained in the HyperDICE latch circuit (SEU) occurs when total any three or more OFF-state transistors in and across different HyperDICE elements (e.g., HDE 2 and HDE 4) are simultaneously inverted. As shown in FIG. 9, even when two or less transistors in and across different HyperDICE elements, e.g., P2_2 in HDE 2 and N4_4 in HDE 4, are simultaneously inverted, the inversion of data stored in HDE 3 in the ON-state never occurs, and thereby no SEU occurs in the HyperDICE latch circuit (HDL).

Figure 10:
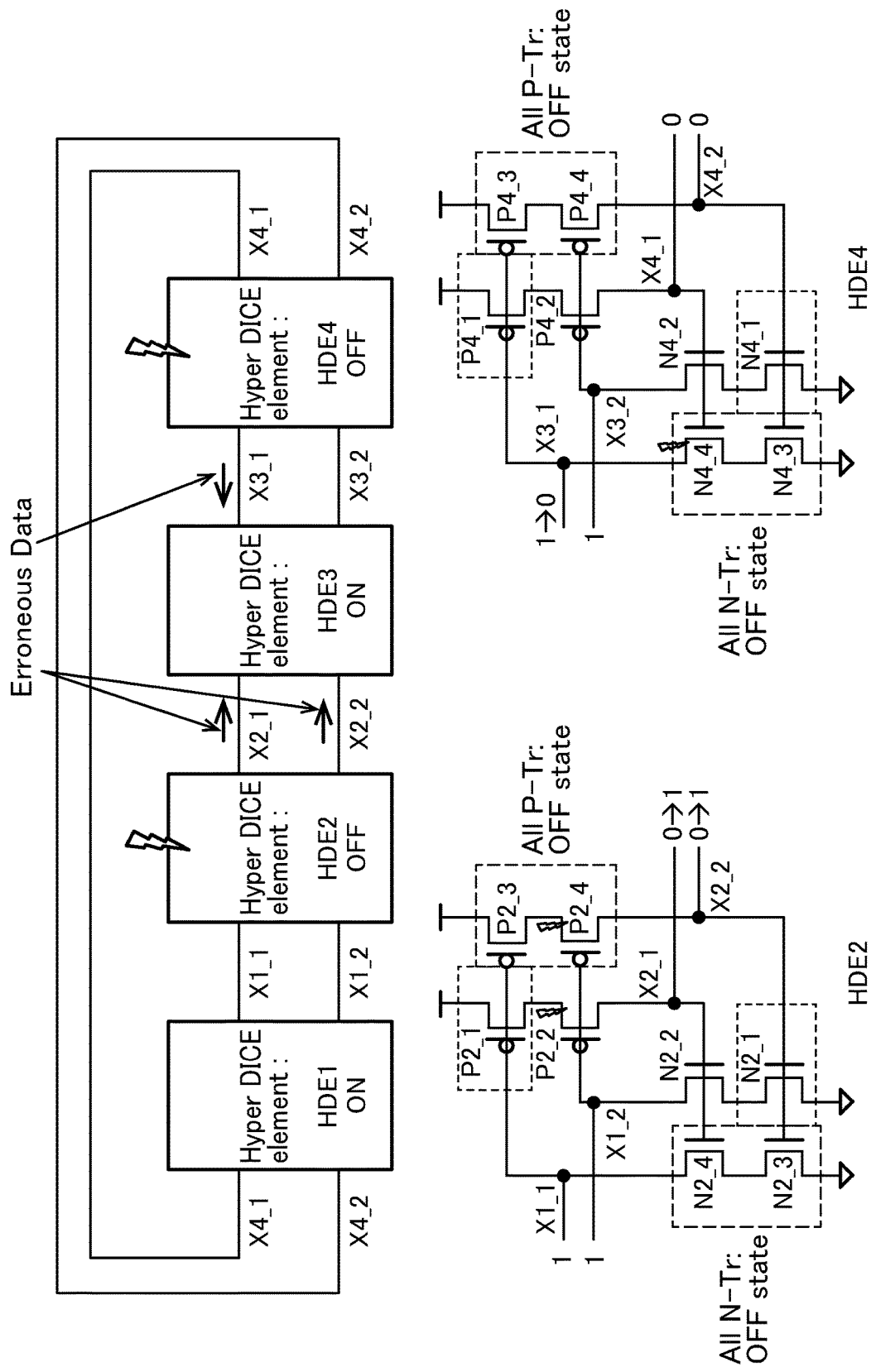
FIG. 10 is an explanatory diagram showing the principle of SEU tolerance of the HyperDICE latch circuit (HDL), in a situation where the occurrence of SEU cannot be prevented.

FIG. 10 is an explanatory diagram showing the principle of SEU tolerance of the HyperDICE latch circuit (HDL), in a situation where the occurrence of SEU cannot be prevented. The inversion of data stored in the HyperDICE latch circuit (SEU) occurs when any number of total three or more of OFF-state transistors in and across different HyperDICE elements (e.g., HDE 2 and HDE 4) are simultaneously inverted. In a case where, as a result of a phenomenon that total three OFF-state transistors in and across two Off-state HyperDICE elements on both sides of one ON-state HyperDICE element (e.g., HDE 3) are inverted due to incidence of energetic particle, erroneous data at three nodes is given to the ON-state HyperDICE element (e.g., HDE 3), the ON-state HyperDICE element (e.g., HDE 3) whose data is to be complemented in a normal situation is brought into a malfunction state, so that the data complement function does not work, resulting in the occurrence of SEU in the HyperDICE latch circuit.

The lower left diagram in FIG. 10 is a transistor-level circuit diagram of the OFF-state HyperDICE element (HDE) 2. All the eight transistors constituting HDE 2 are in the OFF state. When the state of two (P2_2 and P2_4) of the eight transistors is changed from the OFF state to the ON state under the influence of incidence of energetic particle, an input signal to be transmitted from HDE 2 to the ON-state HyperDICE element (HDE) 3 adjacent to HDE 2, via each of the nodes X2_1 and X2_2, is changed from the 0 state which is a proper state, to the 1 state.

The lower right diagram in FIG. 10 is a transistor-level circuit diagram of the OFF-state HyperDICE element (HDE) 4. All the eight transistors constituting HDE 4 are in the OFF state. When the state of one (N4_4) of the eight transistors is changed from the OFF state to the ON state under the influence of incidence of energetic particles, an input signal to be transmitted from HDE 4 to the ON-state HyperDICE element (HDE) 3 adjacent to HDE 4, via the node X3_1, is changed from the 0 state which is a proper state, to the 1 state. Upon simultaneous occurrence of the phenomena in the lower left diagram and the lower right diagram in FIG. 10, three of the four input signals to the ON-state HyperDICE element (HDE) 3 are changed to a logical state different from the proper logical state. Thus, data retained in the ON-state HyperDICE element (HDE) 3 is inverted, and the data complementary relationship based on the ON-state HyperDICE element is spoiled, resulting in the occurrence of SEU in the HyperDICE latch circuit. Here, in a Bulk process, all transistors have a possibility that they are short-circuited to GND/VDD, due to a substrate/well structure. Thus, in a serial two-stage transistor structure as shown in the lower left and lower right diagrams in FIG. 10, even when one of the two transistors is turned on, GND/VDD will appear in its output. This is different from an SOI process in which all transistors are isolated.

(Critical Transistors)

FIG. 11 is an explanatory diagram of critical transistors. In (a) a conventional DICE circuit described on the left side of FIG. 11, when two critical transistors (critical transistor pair) are arranged on a trajectory of incidence of energetic particles, there is a risk that they are simultaneously inverted, resulting in the occurrence of SEU. In a HyperDICE circuit described on the right side of FIG. 11, as the area of opening of a rectangle having apexes at three critical transistors becomes larger, a risk that the three critical transistors are simultaneously inverted by the same incident particle to cause the occurrence of SEU becomes lower. From a viewpoint of further enhancing SEU tolerance, at least two of three transistors in the same one of a plurality of combinations of critical transistors are preferably arranged on a vertical or horizontal straight line at a given inter-gate distance in a circuit layout thereof to increase the area of opening of a rectangle having apexes at the critical tri-transistors.

Figure 12:
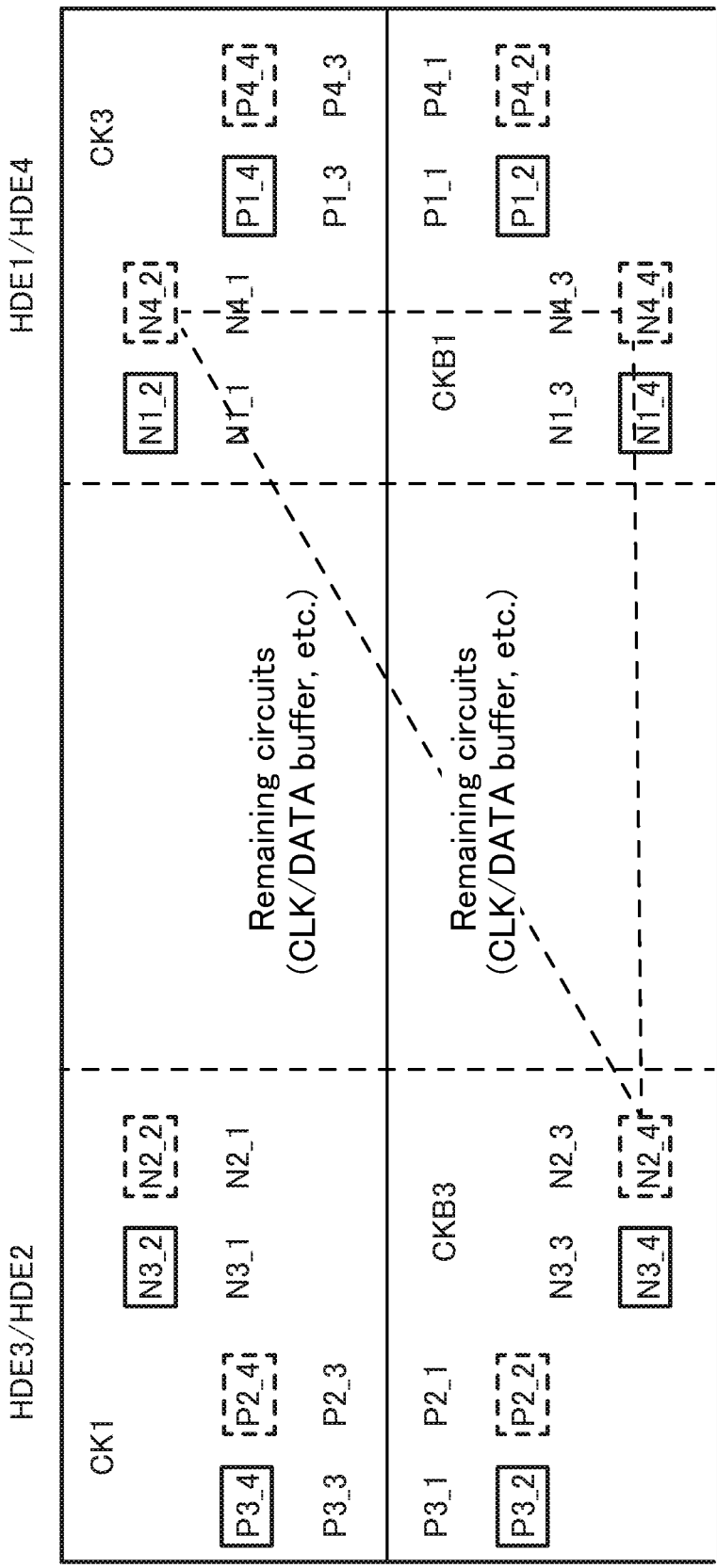
FIG. 12 is a layout diagram of critical transistors.

The critical tri-transistor will be described below. FIG. 12 is a layout diagram of critical transistors. This figure shows the layout of transistors or the like. Transistors each indicated by surrounding its reference sign by a rectangular solid line is all critical transistor candidates set when HDE 1 and HDE 3 are in the isolated state, and transistor indicated by surrounding its reference sign by a rectangular dashed line are all critical transistor candidates set when HDE 2 and HDE 4 are in the isolated state. SEU occurs when malfunction occurs in three transistors among the critical transistor candidates set when HDE 1 and HDE 3 are in the isolated state or when HDE 2 and HDE 4 are in the isolated state, wherein each of the three transistors is comprised in a different one of the HyperDICE elements. Such three transistors will hereinafter be referred to as "critical tri-transistor". In FIG. 12, an n-type transistor N2_4, an n-type transistor N4_2, an n-type transistor N4_4, are connected by a dashed line. These three transistors are included in the critical transistor candidates set when HDE 2 and HDE 4 are in the isolated state, and comprised, respectively, in different three of the HyperDICE elements. Thus, these three transistors are the critical tri-transistor.

Figure 13:
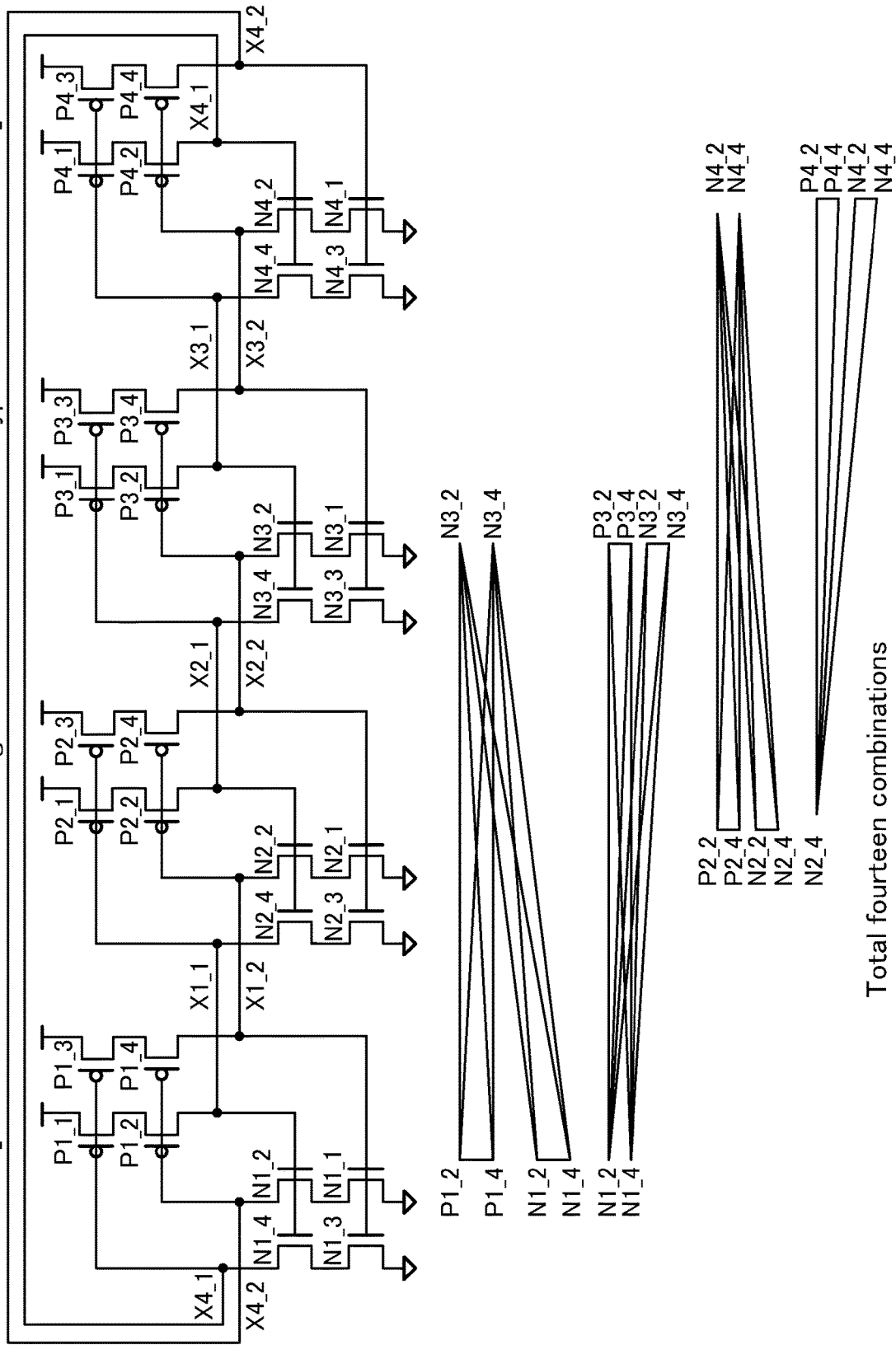
FIG. 13 is an explanatory diagram of a critical tri-transistor causing the occurrence of SEU in the HyperDICE latch circuit (HDL).

FIG. 13 is an explanatory diagram of a critical tri-transistor causing the occurrence of SEU in the HyperDICE latch circuit (HDL). On the lower side of FIG. 13, various combinations of three transistors are denoted by triangular solid lines. Specifically, there are fourteen combinations of three transistors. When three transistors in any one of the fourteen combinations simultaneously malfunction and change from the OFF state to the ON state, data retained in the HyperDICE latch circuit (HDL) is inverted, resulting in the occurrence of SEU. Such a combination of three transistors will hereinafter be referred to as "combination of critical tri-transistors".

FIG. 14 is a table showing a plurality of combinations of critical tri-transistors which should never be simultaneously inverted. This table shows fourteen types of critical tri-transistors set when HDE 1 and HDE 3 are in the isolated state and when HDE 2 and HDE 4 are in the isolated state.

A specific critical tri-transistor of the HyperDICE latch circuit will be described below, using terms distinguished from each other by assigning ordinal numbers to each circuit element name. That is, the critical tri-transistor (the combination of three critical transistors) whose simultaneous inversion can cause the occurrence of single event includes the following fourteen combinations:

(1) a combination of the first serially-duplicating p-type transistor (P1_2) comprised in the redundant first DICE element, the first parallel-serially-duplicating p-type transistor (P1_4) comprised in the redundant first DICE element, and the third serially-duplicating n-type transistor (N3_2) comprised in the redundant third DICE element;

(2) a combination of the first serially-duplicating p-type transistor (P1_2) comprised in the redundant first DICE element, the first parallel-serially-duplicating p-type transistor (P1_4) comprised in the redundant first DICE element, and the third parallel-serially-duplicating n-type transistor (N3_4) comprised in the redundant third DICE element;

(3) a combination of the first serially-duplicating n-type transistor (N1_2) comprised in the redundant first DICE element, the first parallel-serially-duplicating n-type transistor (N1_4) comprised in the redundant first DICE element, and the third serially-duplicating n-type transistor (N3_2) comprised in the redundant third DICE element;

(4) a combination of the first serially-duplicating n-type transistor (N1_2) comprised in the redundant first DICE element, the first parallel-serially-duplicating n-type transistor (N1_4) comprised in the redundant first DICE element, and the third parallel-serially-duplicating n-type transistor (N3_4) comprised in the redundant third DICE element;

(5) a combination of the first serially-duplicating n-type transistor (N1_2) comprised in the redundant first DICE element, the third serially-duplicating p-type transistor (P3_2) comprised in the redundant third DICE element, and the third parallel-serially-duplicating p-type transistor (P3_4) comprised in the redundant third DICE element;

(6) a combination of the first parallel-serially-duplicating n-type transistor (N1_4) comprised in the redundant first DICE element, the third serially-duplicating p-type transistor (P3_2) comprised in the redundant third DICE element, and the third parallel-serially-duplicating p-type transistor (P3_4) comprised in the redundant third DICE element;

(7) a combination of the first serially-duplicating n-type transistor (N1_2) comprised in the redundant first DICE element, the third serially-duplicating n-type transistor (N3_2) comprised in the redundant third DICE element, and the third parallel-serially-duplicating n-type transistor (N3_4) comprised in the redundant third DICE element;

(8) a combination of the first parallel-serially-duplicating n-type transistor (N1_4) comprised in the redundant first DICE element, the third serially-duplicating n-type transistor (N3_2) comprised in the redundant third DICE element, and the third parallel-serially-duplicating n-type transistor (N3_4) comprised in the redundant third DICE element;

(9) a combination of the second serially-duplicating p-type transistor (P2_2) comprised in the redundant second DICE element, the second parallel-serially-duplicating p-type transistor (P2_4) comprised in the redundant second DICE element, and the fourth serially-duplicating n-type transistor (N4_2) comprised in the redundant fourth DICE element;

(10) a combination of the second serially-duplicating p-type transistor (P2_2) comprised in the redundant second DICE element, the second parallel-serially-duplicating p-type transistor (P2_4) comprised in the redundant second DICE element, and the fourth parallel-serially-duplicating n-type transistor (N4_4) comprised in the redundant fourth DICE element;

(11) a combination of the second serially-duplicating n-type transistor (N2_2) comprised in the redundant second DICE element, the second parallel-serially-duplicating n-type transistor (N2_4) comprised in the redundant second DICE element, and the fourth serially-duplicating n-type transistor (N4_2) comprised in the redundant fourth DICE element;

(12) a combination of the second serially-duplicating n-type transistor (N2_2) comprised in the redundant second DICE element, the second parallel-serially-duplicating n-type transistor (N2_4) comprised in the redundant second DICE element, and the fourth parallel-serially-duplicating n-type transistor (N4_4) comprised in the redundant fourth DICE element;

(13) a combination of the second parallel-serially-duplicating n-type transistor (N2_4) comprised in the redundant second DICE element, the fourth serially-duplicating p-type transistor (P4_2) comprised in the redundant fourth DICE element, and the fourth parallel-serially-duplicating p-type transistor (P4_4) comprised in the redundant fourth DICE element; and

(14) a combination of the second parallel-serially-duplicating n-type transistor (N2_4) comprised in the redundant second DICE element, the fourth serially-duplicating n-type transistor (N4_2) comprised in the redundant fourth DICE element, and the fourth parallel-serially-duplicating n-type transistor (N4_4) comprised in the redundant fourth DICE element.

Further, it is preferable that at least two of three transistors in the same combination are arranged on a vertical or horizontal straight line at a given inter-gate distance in a circuit layout thereof. For example, in a 65 nm process, the inter-gate distance of the critical transistors at the apexes of a triangle is preferably set to 1.2 µm or more. In a memory element according to the present invention, designed and produced by a semiconductor CMOS process capable of coping a size of 65 µm or less, it has been ascertained that a resistance of 68 MeV or more/(mg/cm$^2$) to single event upset and single event transient due to LET (Linear Energy Transfer) of a heavy ion can be obtained, by setting a sufficient inter-gate distance as mentioned above. In outer space, a heavy ion having a LET of 40 MeV or more/(mg/cm$^2$) rarely exists. Thus, it is possible to realize sufficient SEU tolerance.

Figure 15:
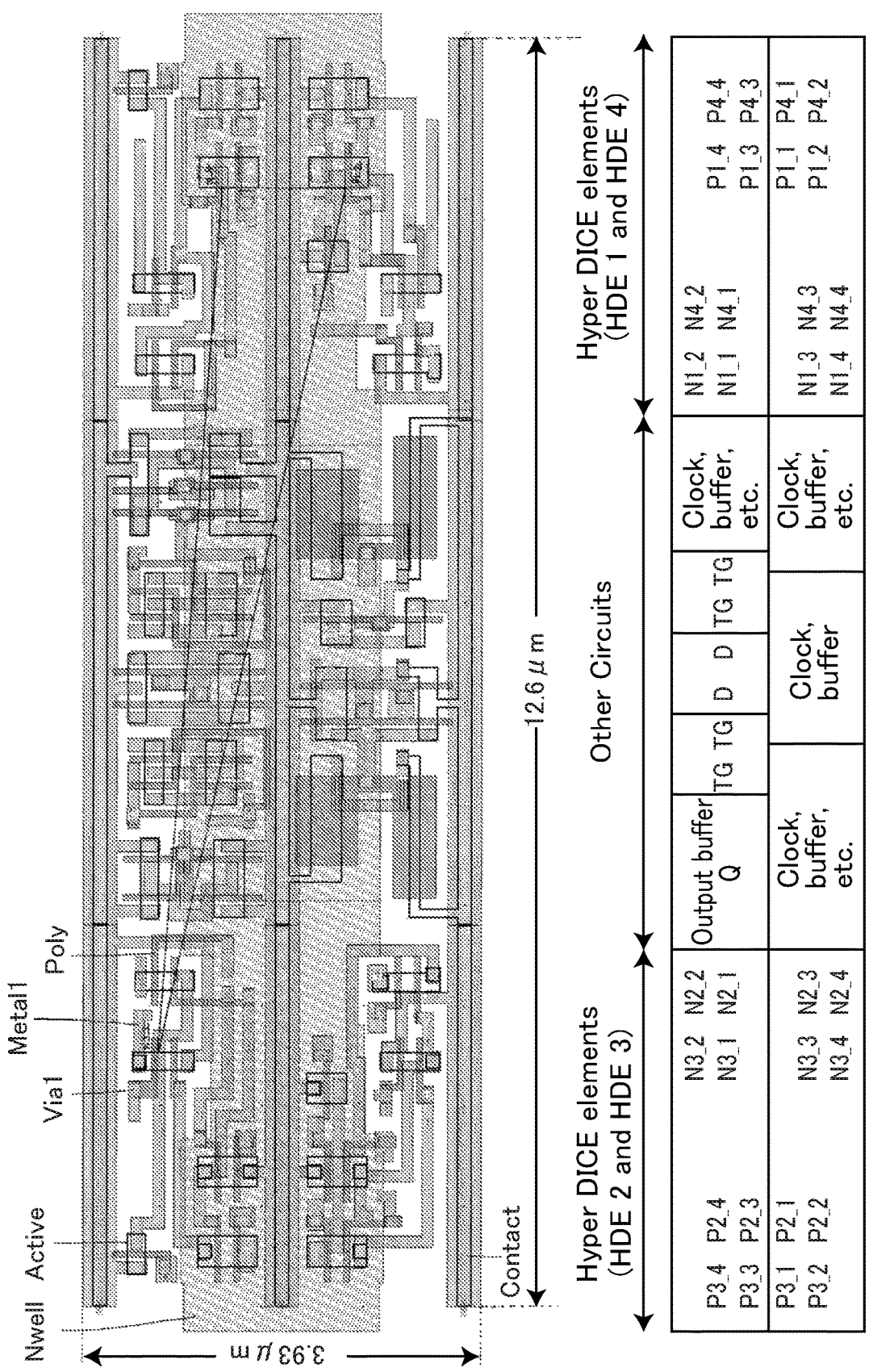
FIG. 15 is a layout diagram of a HyperDICE latch circuit.
Figure 16A:
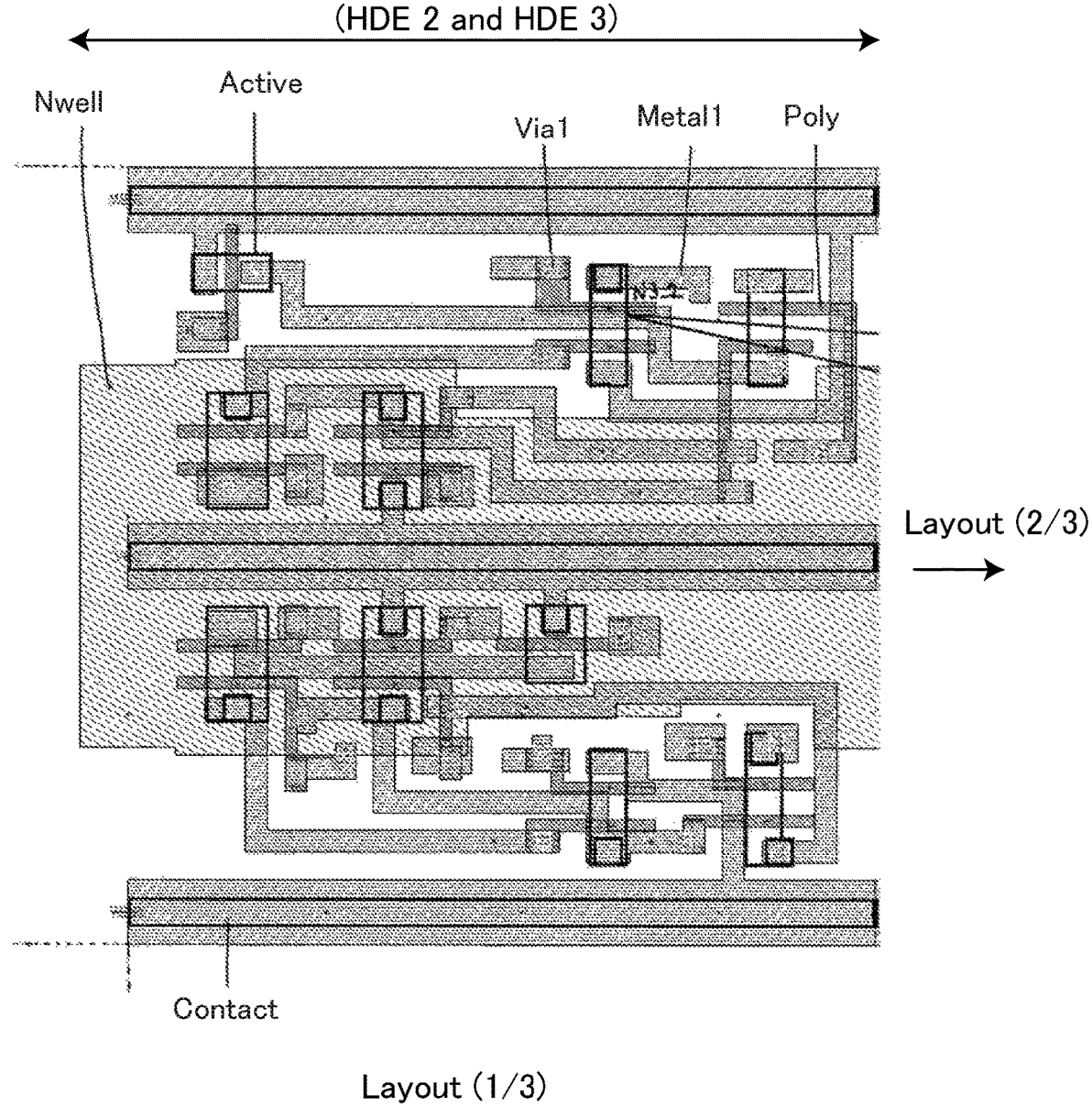
FIGS. 16A to 16C enlargedly show, respectively, three portions obtained by dividing the layout diagram shown on the upper side of FIG. 15.
Figure 16B:
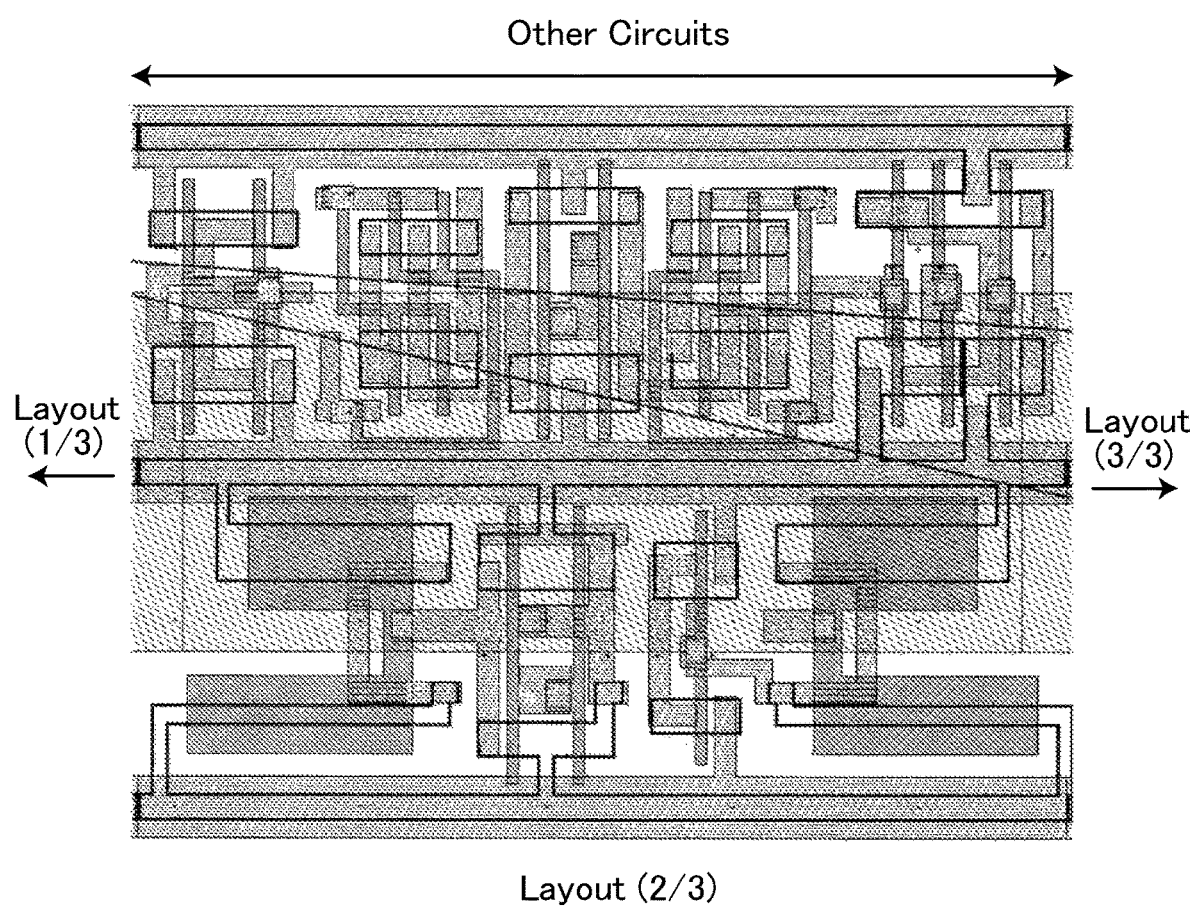
Figure 16C:
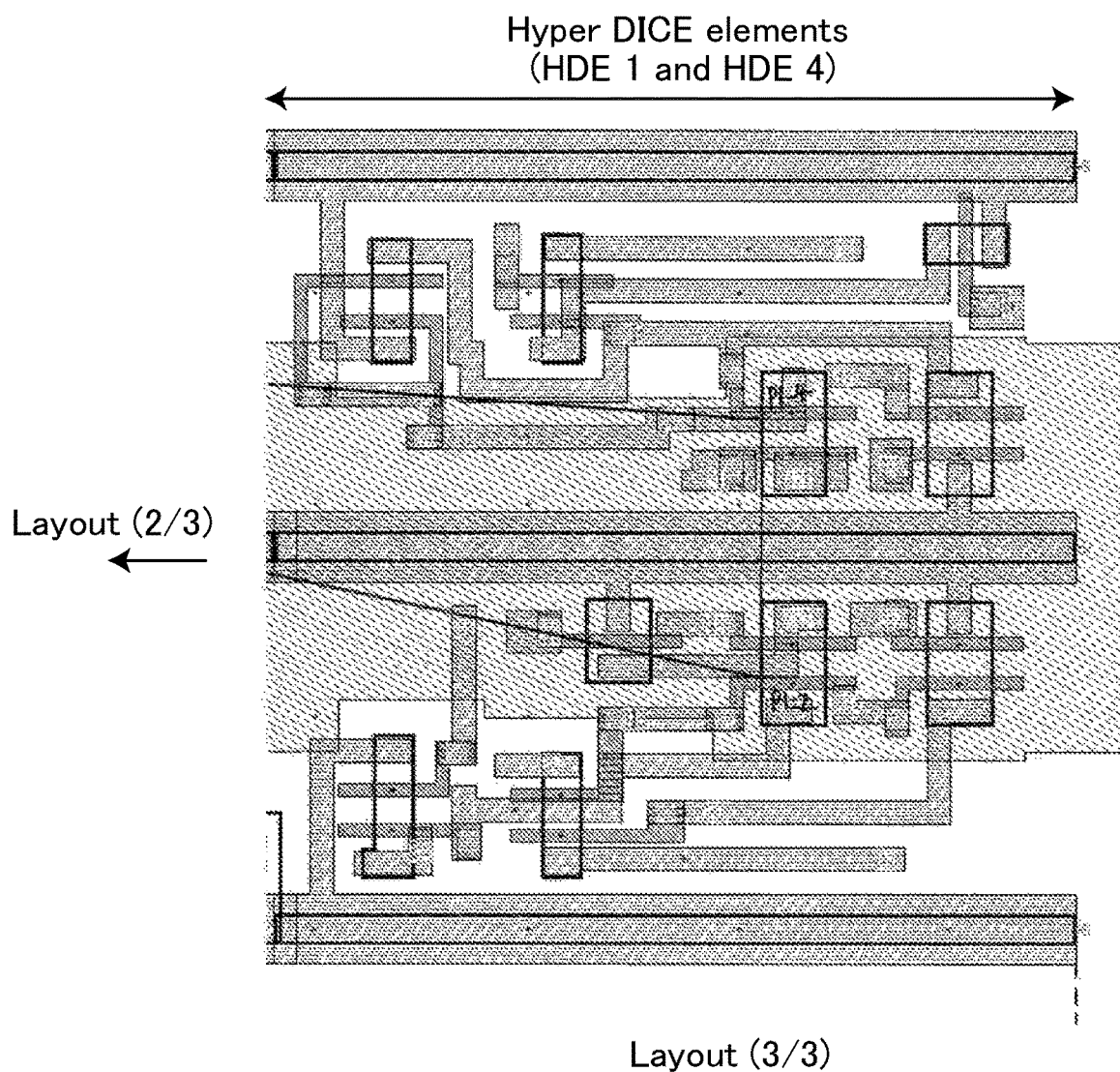

FIG. 15 is a layout diagram of the HyperDICE latch circuit. FIG. 15 shows an example of a specific layout, on the upper side thereof, and explanation about circuits for the upper diagram, on the lower side thereof. Further, FIGS. 16A to 16C enlargedly show, respectively, three portions obtained by dividing the layout diagram shown on the upper side of FIG. 15. The layout is roughly separated into two HyperDICE elements, and other circuits (clock buffer, output buffer, etc.) in a rightward-leftward direction, and also separated into two in an upward-downward direction. A structure in which two layouts are arranged side-by-side in the upward-downward direction is referred to as "double height structure". Specifically, the HyperDICE element (HDE) 1 and the HyperDICE element (HDE) 4 are arranged one-above-the-other, and the HyperDICE element (HDE) 2 and the HyperDICE element (HDE) 3 are arranged one-above-the-other. Here, when arranging the two HyperDICE elements one-above-the-other, transistors constituting each one of the HyperDICE elements are preferably arranged in spaced apart relation to each other in the upward-downward direction. For this purpose, the transistors constituting each one of the HyperDICE elements are dispersedly arranged in two upper and lower layouts. In this case, transistors constituting each of the two HyperDICE elements arranged side-by-side in the upward-downward direction are dispersedly arranged in two upper and lower layouts, so that there is no upper-lower relationship between the two HyperDICE elements. Further, a triangular solid line in the upper diagram in FIG. 15 shows one example of arrangement in one type of critical tri-transistor.

Circuits other than the HyperDICE elements are arranged between a set of the HyperDICE element (HDE) 1 and the HyperDICE element (HDE) 4 arranged one-above-the-other, and a set of the HyperDICE element (HDE) 2 and the HyperDICE element (HDE) 3 arranged one-above-the-other. This makes it possible to arrange the HyperDICE elements comprising the critical transistors, with a large distance therebetween in the rightward-leftward direction.

Specifically, the HyperDICE latch circuit has a circuit layout in which: circuits of the redundant first DICE element and the redundant fourth DICE element are arranged one-above-the-other; circuits of the redundant third DICE element and the redundant second DICE element are arranged one-above-the-other; and a circuit other than the circuits of the redundant first DICE element, the redundant second DICE element, the redundant third DICE element and the redundant fourth DICE element is disposed between a set of the redundant first DICE element and the redundant fourth DICE element arranged one-above-the-other and a set of the redundant third DICE element and the redundant second DICE element arranged one-above-the-other.

(Triplicated HyperDICE Element)

A technique for making a transistor redundant based on duplication has been described. Similarly, it is possible making a transistor redundant based on triplication or k-plication (where k is an integer of 4 or more) such as quadruplication, to further improve the SEU tolerance.

Figure 17A:
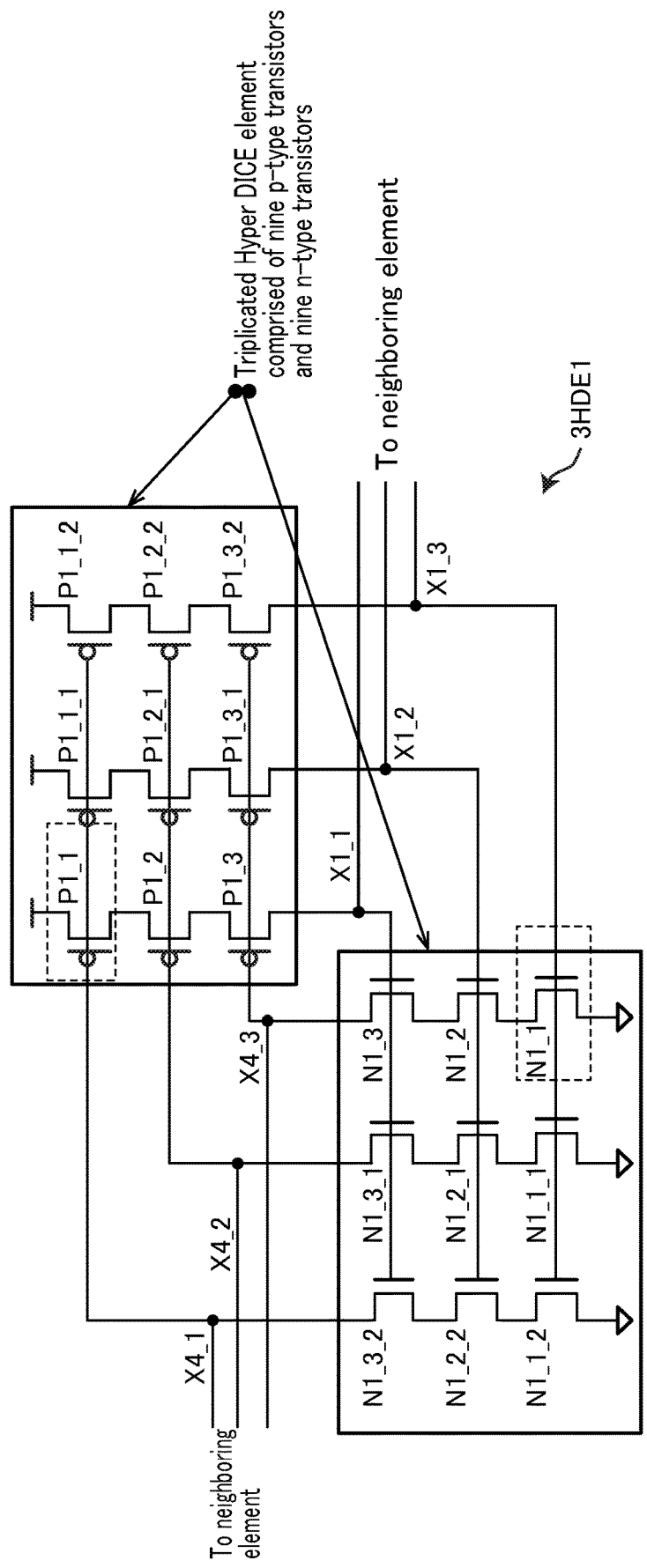
FIG. 17A is a circuit diagram of a triplicated HyperDICE element (3HDE).

FIG. 17A is a circuit diagram of a triplicated HyperDICE element (3HDE). FIG. 17A shows a circuit of a first triplicated HyperDICE element (3HDE) 1, wherein: with respect to a set of a p-type transistor P1_1, a p-type transistor P1_2, and a p-type transistor P1_3 which are triplicated in series, a set of a p-type transistor P1_1_1, a p-type transistor P1_2_1, and a p-type transistor P1_3_1 which are triplicated in series, and a set of a p-type transistor P1_1_2, a p-type transistor P1_2_2, and a p-type transistor P1_3_2 which are triplicated in series are connected in parallel; and, with respect to a set of an n-type transistor N1_1, an n-type transistor N1_2, and an n-type transistor N1_3 which are triplicated in series, a set of an n-type transistor N1_1_1, an n-type transistor N1_2_1, and an n-type transistor N1_3_1 which are triplicated in series, and a set of an n-type transistor N1_1_2, an n-type transistor N1_2_2, and an n-type transistor N1_3_2 which are triplicated in series are connected in parallel.

Figure 17B:
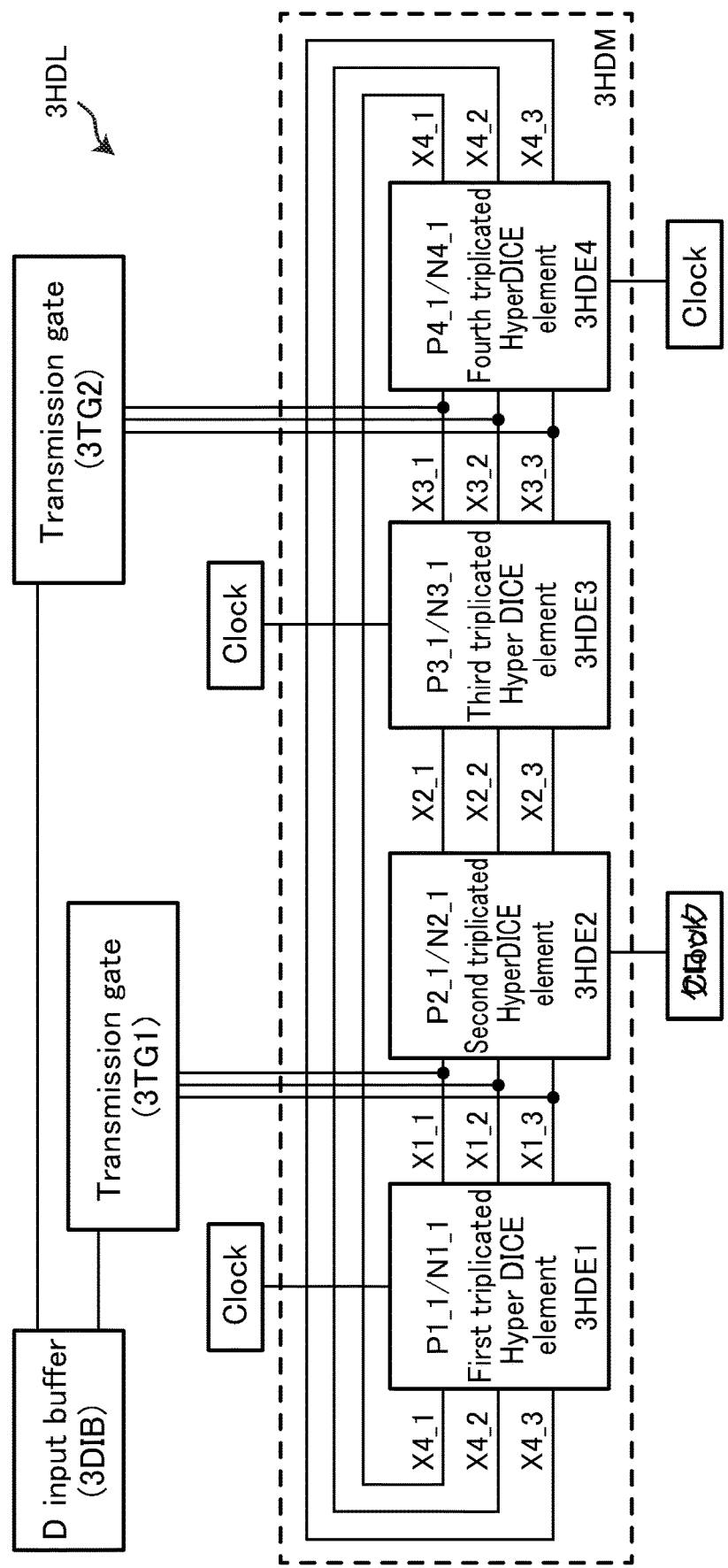
FIG. 17B is a block diagram of a triplicated HyperDICE latch circuit (3HDL).

FIG. 17B is a block diagram of a triplicated HyperDICE latch circuit (3HDL). A triplicated HyperDICE memory section (3HDM) is obtained by connecting four triplicated HyperDICE elements (3HDE 1, 3HDE 2, 3HDE 3, 3HDE 4) in a loop configuration. Each of the triplicated HyperDICE elements has six connection points (nodes), and nodes X4_1, X4_2, X4_3, X1_1, X1_2, X1_3 of the triplicated HyperDICE elements (3HDE) 1 are shared by and connected by nodes X4_1, X4_2, X4_3 of the triplicated HyperDICE elements (3HDE) 4 and nodes X1_1, X1_2, X1_3 of the triplicated HyperDICE elements (3HDE) 2, respectively. Similarly, nodes X1_1, X1_2, X1_3, X2_1, X2_2, X2_3 of the triplicated HyperDICE elements (3HDE) 2 are shared by and connected by the nodes X1_1, X1_2, X1_3 of the triplicated HyperDICE elements (3HDE) 1 and nodes X2_1, X2_2, X2_3 of the triplicated HyperDICE elements (3HDE) 3, respectively. Further, nodes X2_1, X2_2, X2_3, X3_1, X3_2, X3_3 of the triplicated HyperDICE elements (3HDE) 3 are shared by and connected by the nodes X2_1, X2_2, X2_3 of the triplicated HyperDICE elements (3HDE) 2 and nodes X3_1, X3_2, X3_3 of the triplicated HyperDICE elements (3HDE) 4, respectively. Further, nodes X3_1, X3_2, X3_3, X4_1, X4_2, X4_3 of the triplicated HyperDICE elements (3HDE) 4 are shared by and connected by the nodes X3_1, X3_2, X3_3 of the triplicated HyperDICE elements (3HDE) 3 and the nodes X4_1, X4_2, X4_3 of the triplicated HyperDICE elements (3HDE) 1, respectively.

In the triplicated HyperDICE latch circuit (3HDL), each of the first p-type transistor (P1_1), the first n-type transistor (N1_1), the second p-type transistor (P2_1), the second n-type transistor (N2_1), the third p-type transistor (P3_1), the third n-type transistor (N3_1), the fourth p-type transistor (P4_1) and the fourth n-type transistor (N4_1) which are comprised therein before triplication is configured such that eight transistors for redundancy are added thereto at respective positions so as to form an nine-transistor circuit in which a serially triplicated circuit is triplicated in parallel, and each of the first data input part and the second data input part is configured to allow the resulting redundant circuit to accept an input from the same data source through three transmission gates.

In the triplicated HyperDICE element, and the triplicated HyperDICE latch circuit comprising the triplicated HyperDICE element, by redundancy based on triplication, the number of transistors forming the critical combination (transistors whose inversion can cause the occurrence of SEU) is increased. This provides an advantageous effect of being able to obtain more excellent SEU tolerance.

(K-plicated HyperDICE Element)

FIG. 18A is a circuit diagram of a k-plicated HyperDICE element (kHDE1) (where k is an integer of 4 or more). FIG. 18A shows a circuit of a first k-plicated HyperDICE element (kHDE) 1, where k=4, wherein: with respect to a set of a p-type transistor P1_1, a p-type transistor P1_2, - - -, and a p-type transistor P1_$k$ which are k-plicated in series, a set of a p-type transistor P1_1_1, a p-type transistor P1_2_1, - - -, and a p-type transistor P1_$k$_1 which are k-plicated in series, and a set of a p-type transistor P1_1_2, a p-type transistor P1_2_2, - - -, and a p-type transistor P1_$k$_2 which are k-plicated in series are connected in parallel; and with respect to a set of an n-type transistor N1_1, an n-type transistor N1_2, - - -, and an n-type transistor N1_$k$ which are k-plicated in series, a set of an n-type transistor N1_1_1, an n-type transistor N1_2_1, - - -, and an n-type transistor N1_$k$_1 which are k-plicated in series, and a set of an n-type transistor N1_1_2, an n-type transistor N1_2_2, - - -, and an n-type transistor N1_$k$_2 which are k-plicated in series are connected in parallel.

Figure 18B:
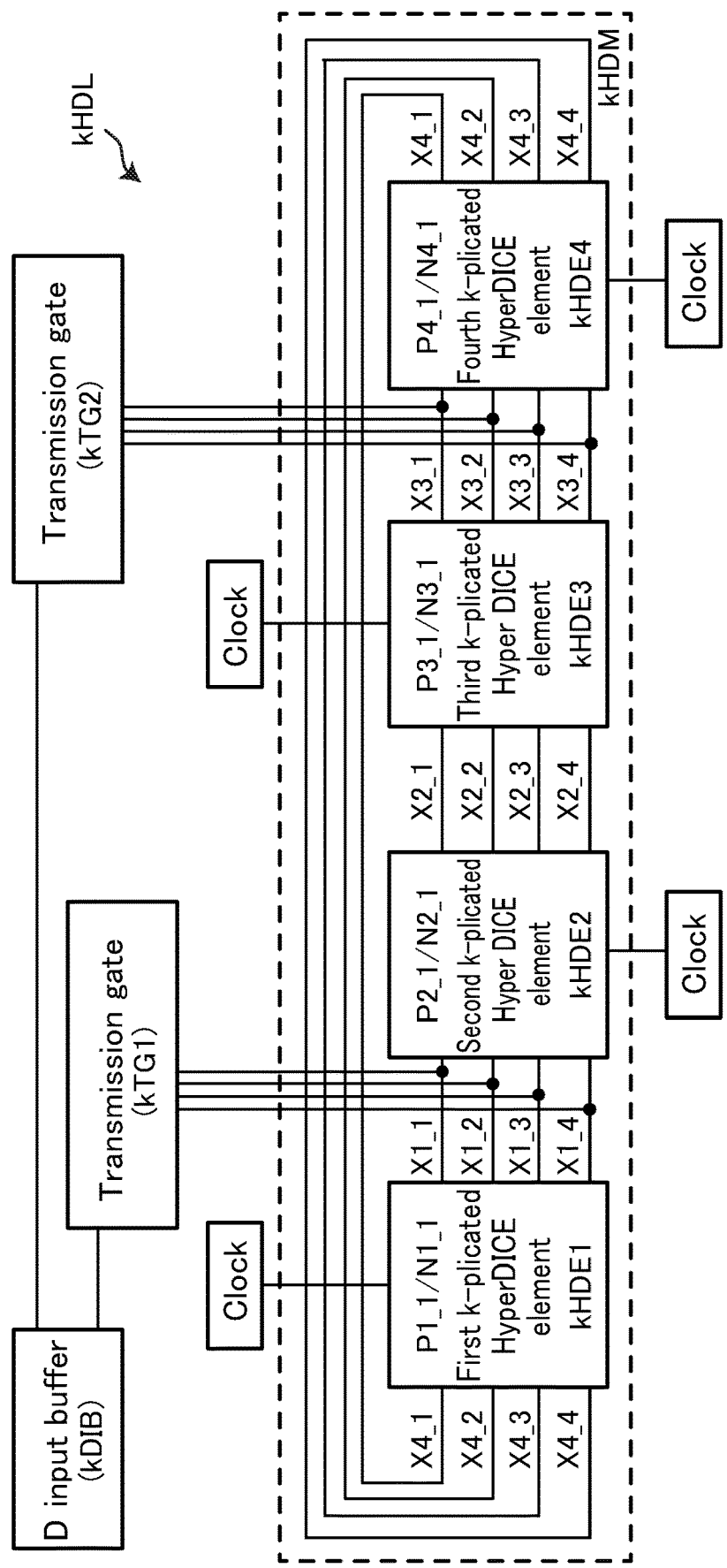
FIG. 18B is a block diagram of a k-plicated HyperDICE latch circuit (kHDL).

FIG. 18B is a block diagram of a k-plicated HyperDICE latch circuit (kHDL). In this figures, a memory section obtained when k=4 is shown. A k-plicated HyperDICE memory section (kHDM) is obtained by connecting four k-plicated HyperDICE elements (kHDE 1, kHDE 2, kHDE 3, kHDE 4) in a loop configuration. Further, a k-plicated HyperDICE latch circuit (kHDL) can be constructed by adding a clock circuit and a data input part to the k-plicated HyperDICE memory section (kHDM).

In the k-plicated HyperDICE latch circuit, each of the first p-type transistor (P1_1), the first n-type transistor (N1_1), the second p-type transistor (P2_1), the second n-type transistor (N2_1), the third p-type transistor (P3_1), the third n-type transistor (N3_1), the fourth p-type transistor (P4_1) and the fourth n-type transistor (N4_1) which are comprised therein before k-plication is configured such that $(k^2-1)$ transistors for redundancy are added thereto at respective positions so as to form a $k^2$-transistor circuit in which a serially k-plicated circuit is k-plicated in parallel, and each of the first data input part and the second data input part is configured to allow the resulting redundant circuit to accept an input from the same data source through k transmission gates.

In the k-plicated HyperDICE element, and the k-plicated HyperDICE latch circuit comprising the k-plicated HyperDICE element, by redundancy based on k-plication, the number of transistors forming the critical combination (transistors whose inversion can cause the occurrence of SEU) is increased. This provides an advantageous effect of being able to obtain more excellent SEU tolerance.

(Flip-Flop Circuit)

A HyperDICE flip-flop circuit (HDFF) can be constructed by combining two HyperDICE latch circuits (HDLs).

Figure 19:
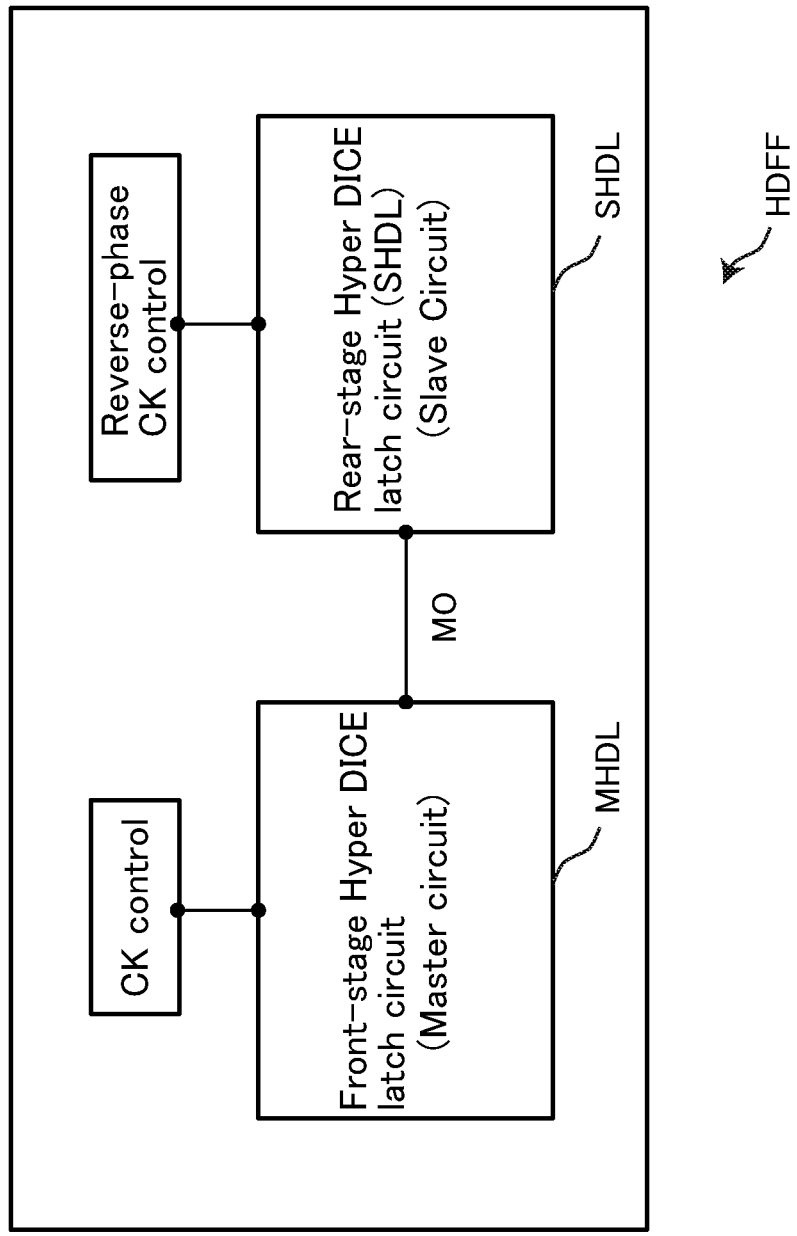
FIG. 19 is a block diagram of a HyperDICE flip-flop circuit (HDFF).
Figure 20:
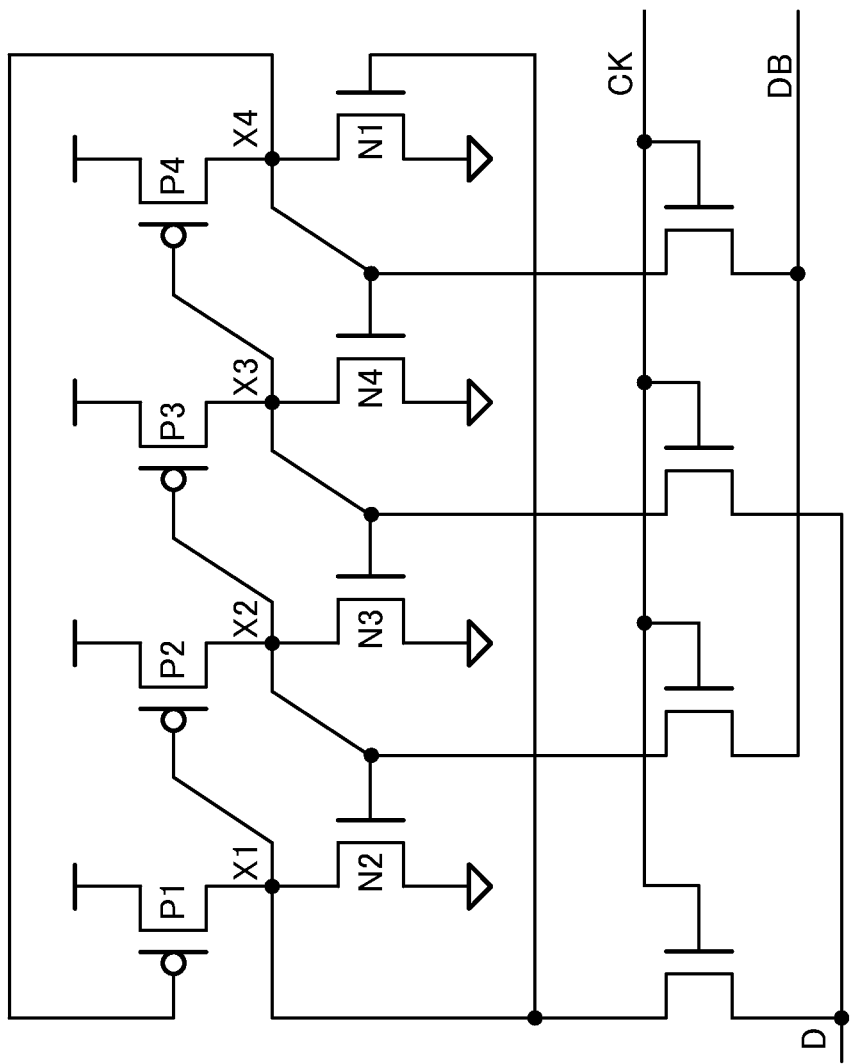
FIG. 20 is a circuit diagram of a DICE circuit described in FIG. 4 on page 2877 of the research paper titled "Upset Hardened Memory Design for Submicron CMOS Technology" (Non-Patent Document 1).
Figure 21:
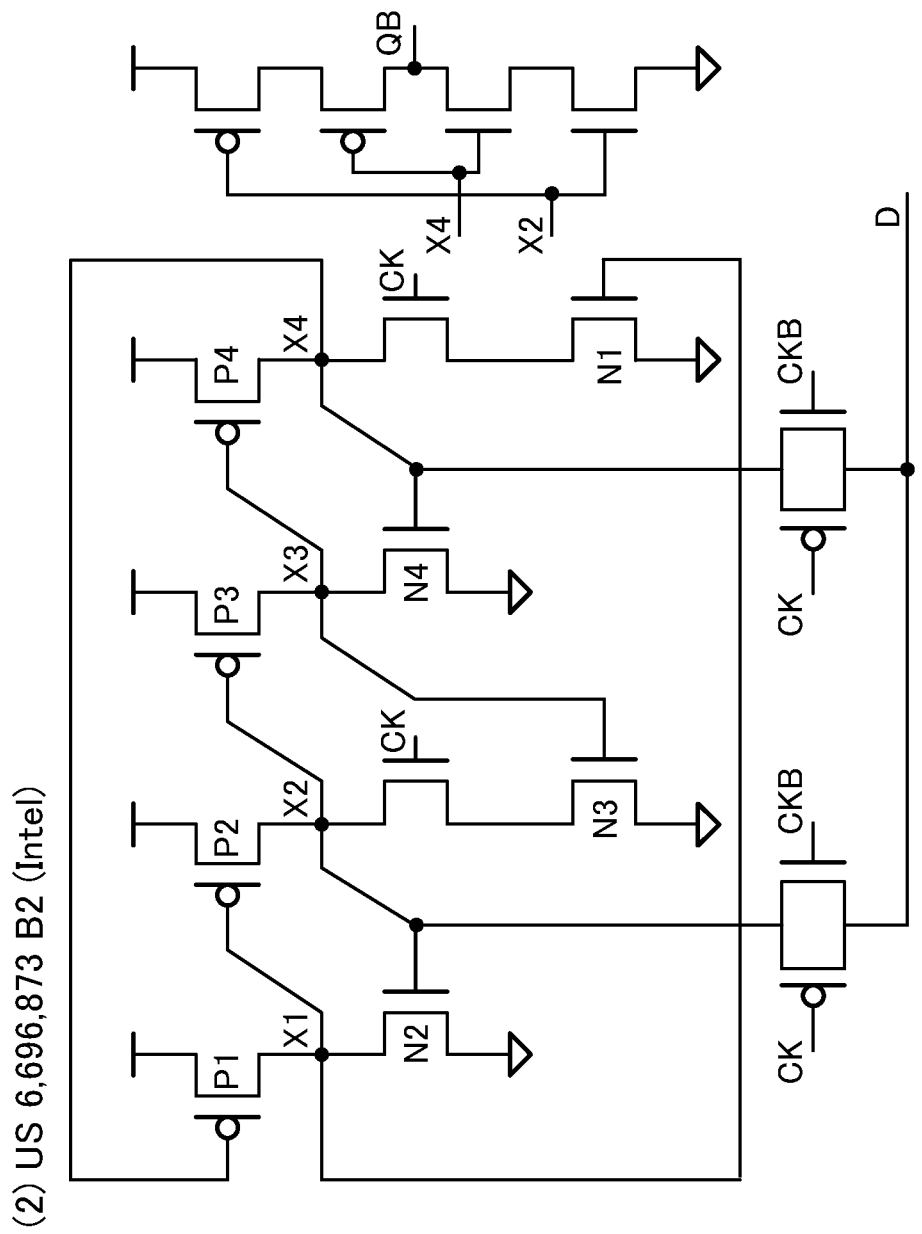
FIG. 21 is a circuit diagram of a DICE circuit described in U.S. Pat. No. 6,696,873 B2 (Patent Document 1).
Figure 22:
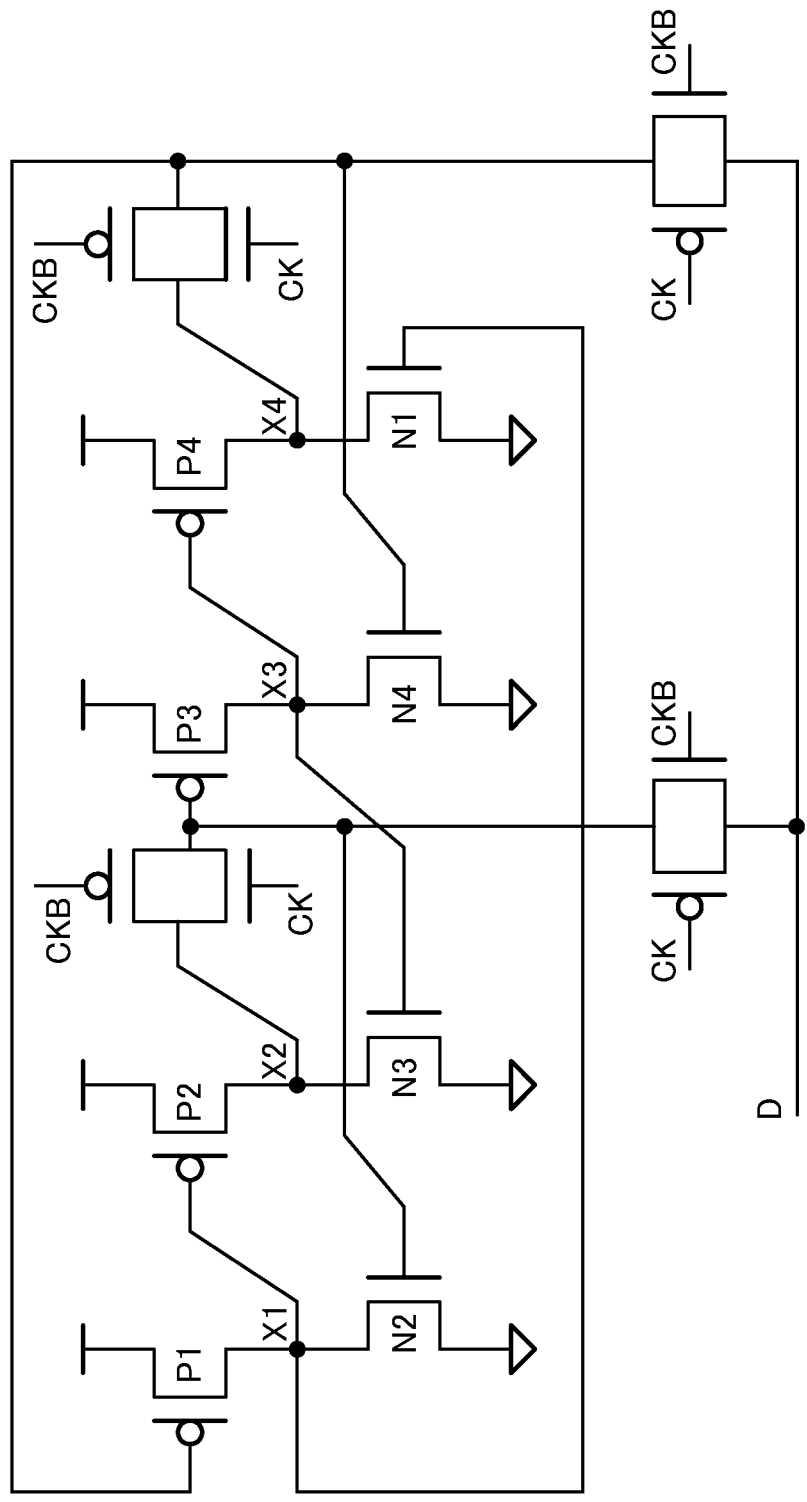
FIG. 22 is a circuit diagram of a DICE circuit described in U.S. Pat. No. 6,327,176 B2 (Patent Document 2).
Figure 23:
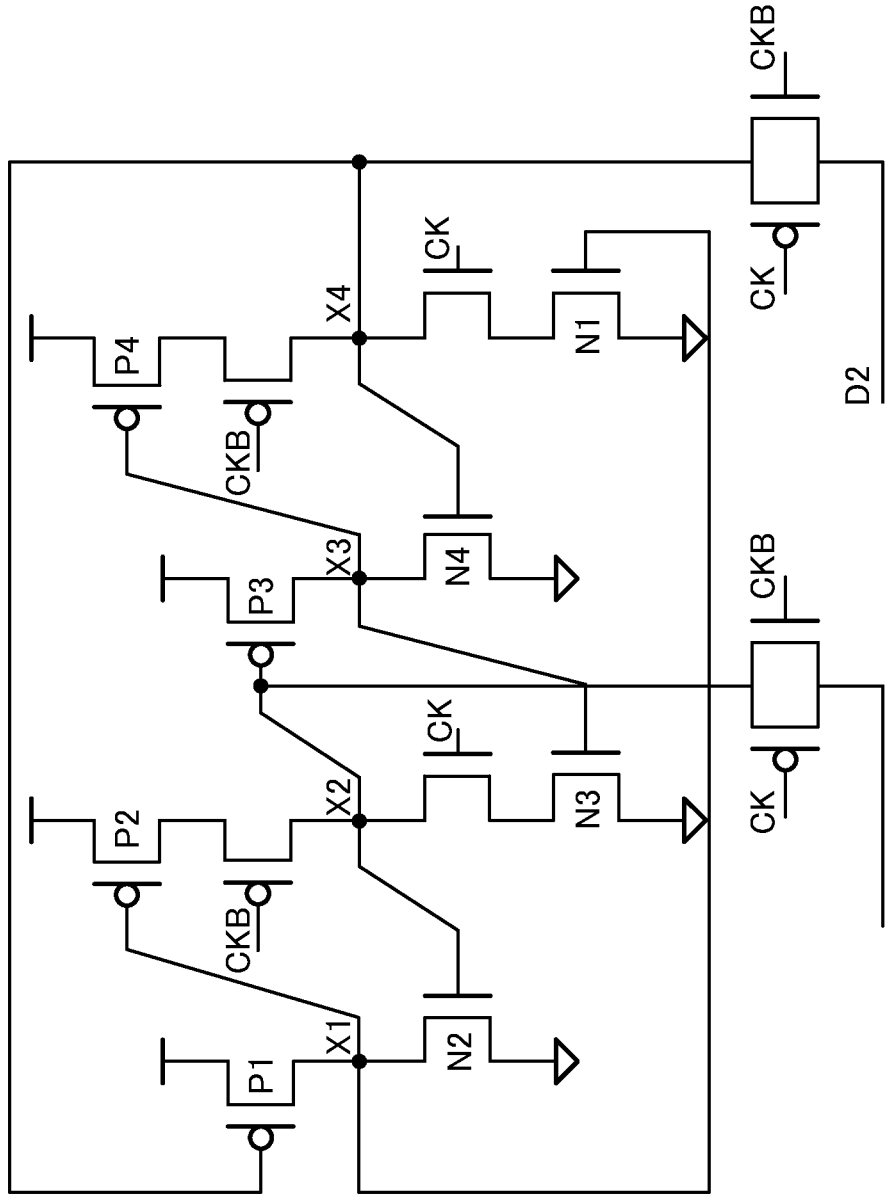
FIG. 23 is a circuit diagram of a DICE circuit described in US 2004/0017237 A1 (Patent Document 3) and U.S. Pat. No. 6,696,874 B2 (Patent Document 4).
Figure 24:
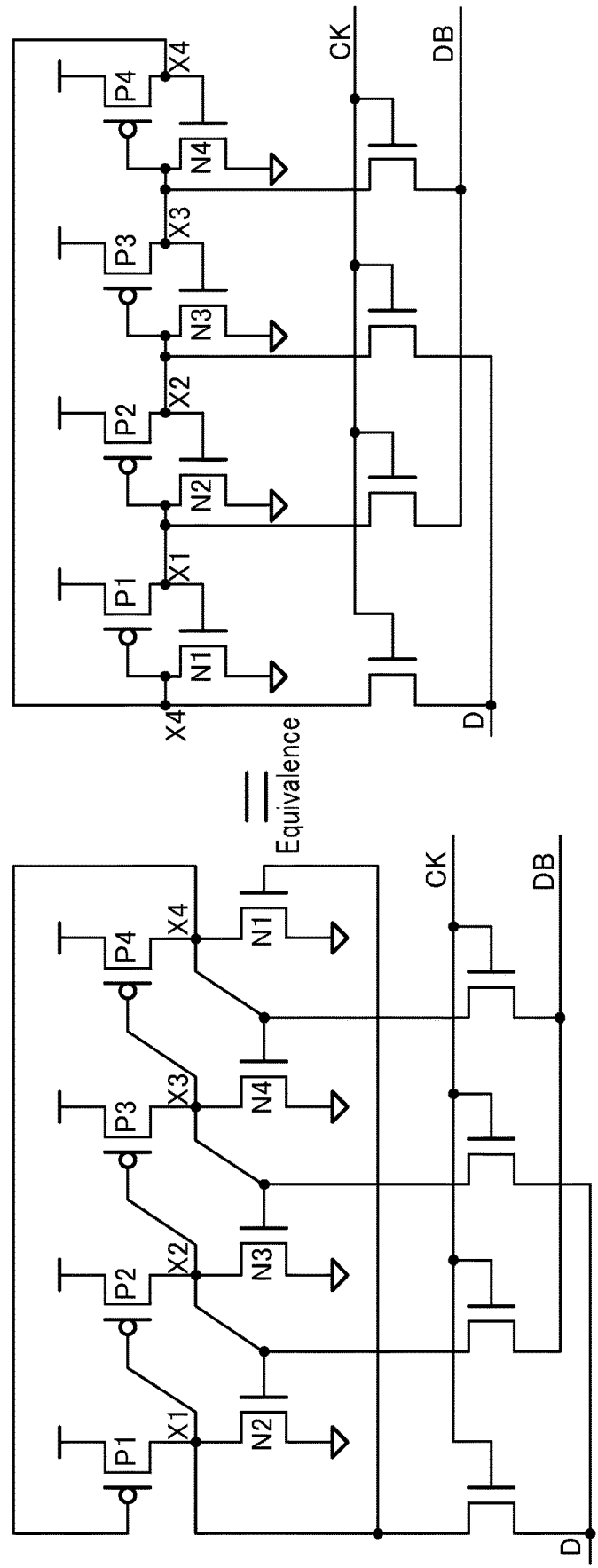
FIG. 24 is a circuit diagram of two equivalent DICE circuits represented by using two types of representation methods.
Figure 25:
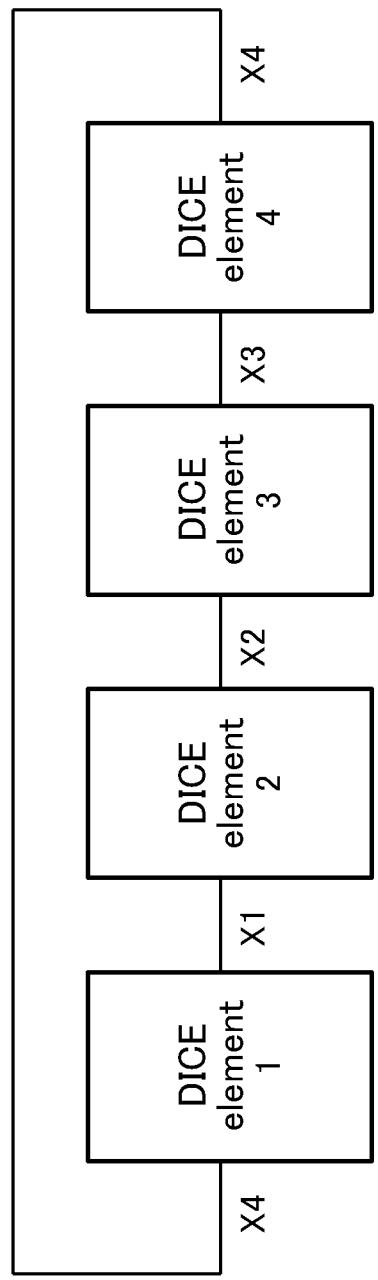
FIG. 25 is a block diagram representing a DICE circuit as a circuit composed of a plurality of DICE elements.
Figure 26:
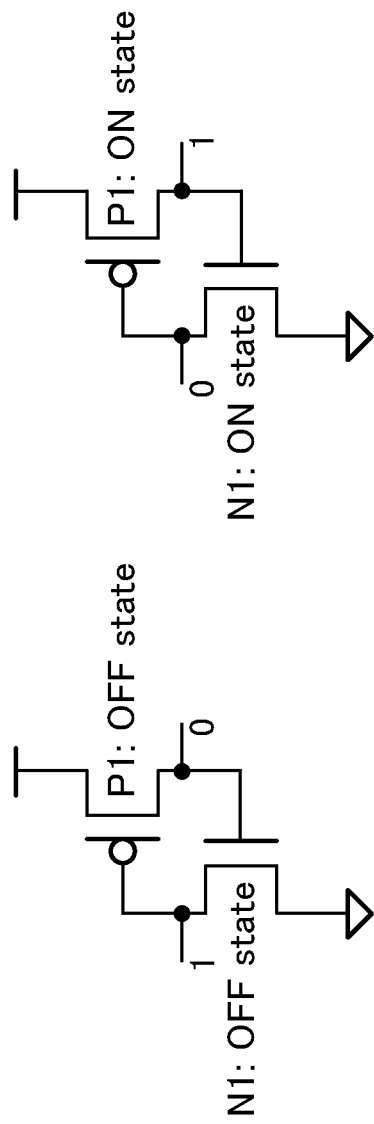
FIG. 26 is an explanatory diagram of a data storage operation of the DICE circuit.
Figure 27:
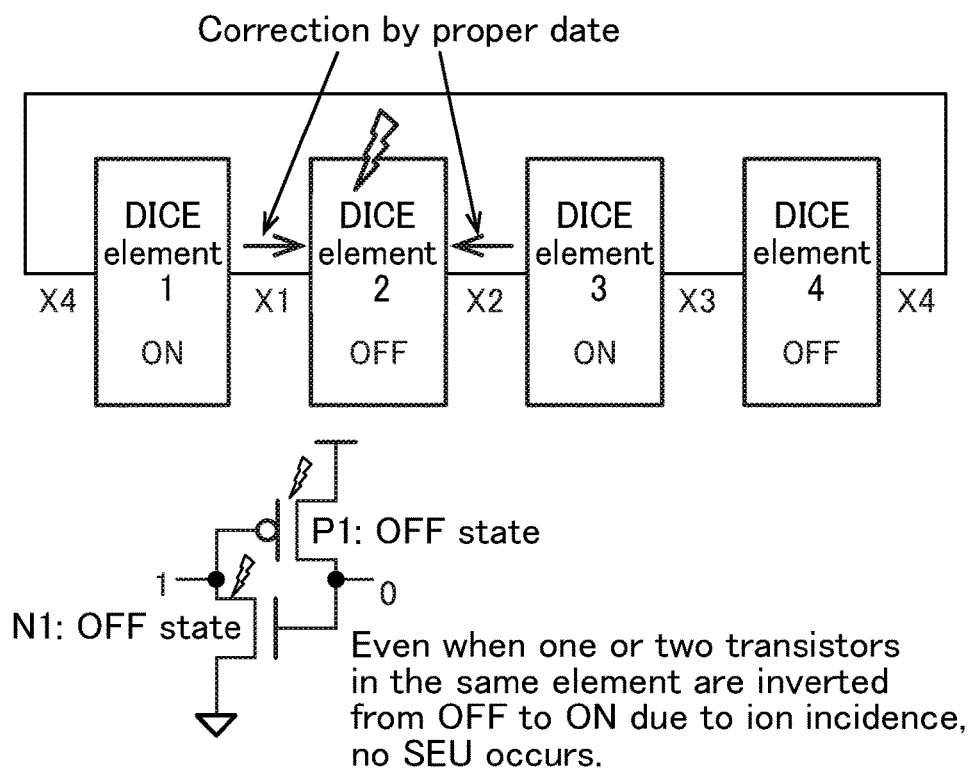
FIG. 27 is an explanatory diagram of the principle of the SEU tolerance of the conventional DICE circuit.
Figure 28:
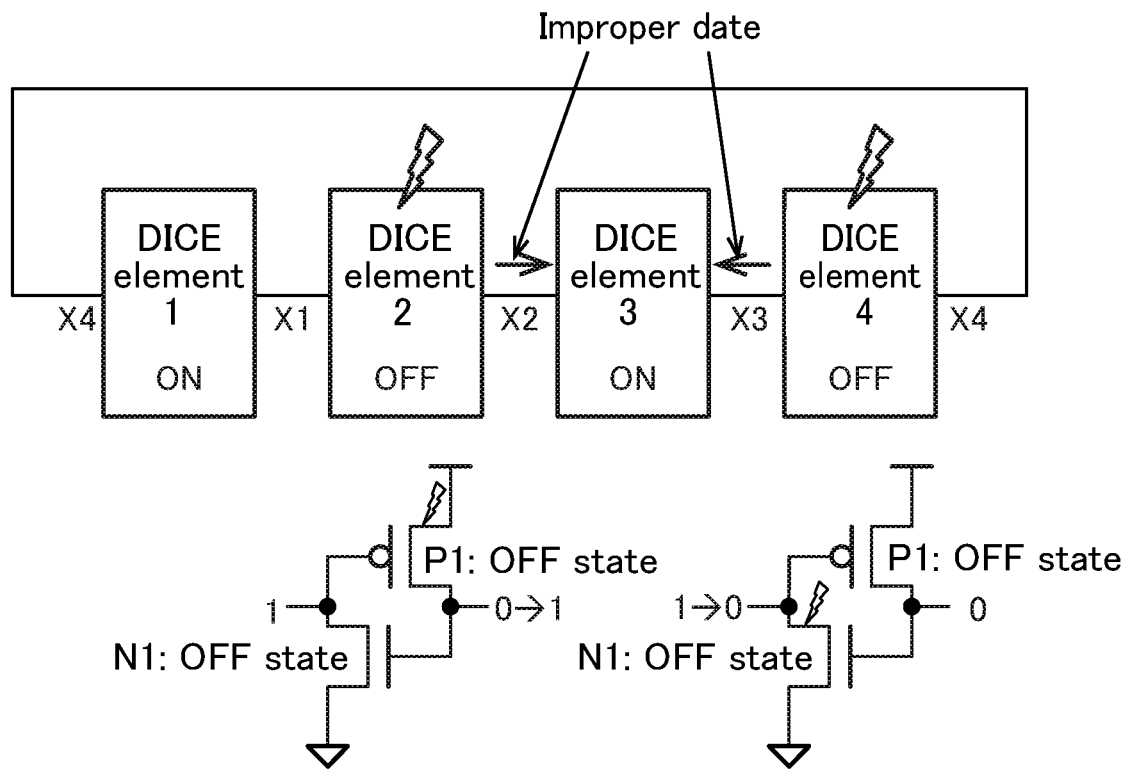
FIG. 28 is an explanatory diagram of a mechanism by which SEU occurs in the conventional DICE circuit.

FIG. 19 is a block diagram of a HyperDICE flip-flop circuit (HDFF). Specifically, the HyperDICE flip-flop circuit (HDFF) can be constructed by allowing an intermediate output (MO) from a front-stage HyperDICE latch circuit (MHDL) disposed at a front stage of the circuit to be input to a rear-stage HyperDICE latch circuit (SHDL) disposed at a rear stage of the circuit, wherein the front-stage HyperDICE latch circuit (MHDL) is configured to function as a master circuit and receive a first clock signal, and the rear-stage HyperDICE latch circuit (SHDL) is configured to function as a slave circuit and receive a second clock signal having a phase reverse to that of the first clock.

The HyperDICE flip-flop circuit (HDFF) comprises the SEU-tolerant HyperDICE latch circuit, so that it has the same SEU tolerance as that of the HyperDICE latch circuit. Further, a triplicated HyperDICE flip-flop circuit (3HDFF) or a k-plicated HyperDICE flip-flop circuit (kHDFF) can be constructed by using the triplicated HyperDICE latch circuit or the k-plicated HyperDICE latch circuit. These have the same SEU tolerance as those of the triplicated HyperDICE latch circuit and the k-plicated HyperDICE latch circuit.

LIST OF REFERENCE SIGNS

DE: DICE element
DE': serially duplicated DICE element
HDE: HyperDICE element
HDM: HyperDICE memory part
HDL: HyperDICE latch circuit
HDFF: HyperDICE flip-flop circuit
3HDE: triplicated HyperDICE element
3HDM: triplicated HyperDICE memory section
3HDL: triplicated HyperDICE latch circuit
kHDE: k-plicated HyperDICE element
kHDM: k-plicated HyperDICE memory section
kHDL: k-plicated HyperDICE latch circuit

What is claimed is:

1. A single event upset-tolerant latch circuit configured such that four Dual Interlocked Storage Cell (DICE) elements are connected in series and in a loop configuration, each of the DICE elements being comprised of a p-type transistor and an n-type transistor, wherein a gate terminal in each one of the p-type and n-type transistors and a drain terminal in the other are mutually connected, each of the DICE elements having a first node Interconnecting between the gate terminal of the p-type transistor and the drain terminal of the n-type transistor, and a second node interconnecting between the drain terminal of the p-type transistor and the gate terminal of the n-type transistor, the single event upset-tolerant latch circuit comprising:
a first DICE element comprised of a first p-type transistor (P1_1) and a first n-type transistor (N1_1), wherein a gate terminal in each one of the first p-type and n-type transistors and a drain terminal in the other are mutually connected;
a second DICE element comprised of a second p-type transistor (P2_1) and a second n-type transistor (N2_1), wherein a gate terminal in each one of the second p-type and n-type transistors and a drain terminal in the other are mutually connected;
a third DICE element comprised of a third p-type transistor (P3_1) and a third n-type transistor (N3_1), wherein a gate terminal in each one of the third p-type and n-type transistors and a drain terminal in the other are mutually connected; and
a fourth DICE element comprised of a fourth p-type transistor (P4_1) and a fourth n-type transistor (N4_1), wherein a gate terminal in each one of the fourth p-type and n-type transistors and a drain terminal in the other are mutually connected;

wherein:
a node interconnecting between a gate terminal of a p-type transistor comprised in the first DICE element and a drain terminal of an n-type transistor comprised in the first DICE element forms a first DICE element's first node;
a node interconnecting between a gate terminal of a p-type transistor comprised in the second DICE element and a drain terminal of an n-type transistor comprised in the second DICE element forms a second DICE element's first node;
a node interconnecting between a gate terminal of a p-type transistor comprised in the third DICE element and a drain terminal of an n-type transistor comprised in the third DICE element forms a third DICE element's first node;
a node interconnecting between a gate terminal of a p-type transistor comprised in the fourth DICE element and a drain terminal of an n-type transistor comprised in the fourth DICE element forms a fourth DICE element's first node;
a node interconnecting between a drain terminal of a p-type transistor comprised in the first DICE element and a gate terminal of an n-type transistor comprised in the first DICE element forms a first DICE element's second node;
a node interconnecting between a drain terminal of a p-type transistor comprised in the second DICE element and a gate terminal of an n-type transistor comprised in the second DICE element forms a second DICE element's second node;
a node interconnecting between a drain terminal of a p-type transistor comprised in the third DICE element and a gate terminal of an n-type transistor comprised in the third DICE element forms a third DICE element's second node; and
a node interconnecting between a drain terminal of a p-type transistor comprised in the fourth DICE element and a gate terminal of an n-type transistor comprised in the fourth DICE element forms a fourth DICE element's second node;
and wherein:
the first DICE element's first node is connected to the fourth DICE element's second node;
the second DICE element's first node is connected to the first DICE element's second node;
the third DICE element's first node is connected to the second DICE element's second node; and
the fourth DICE element's first node is connected to the third DICE element's second node;
and wherein:
the second DICE element's first node and the fourth DICE element's first node are connected, respectively, to a first data input part and a second data input part each configured such that a conduction state thereof is controlled by control of a clock; and
at least one of the first DICE element's second node, the second DICE element's second node, the third DICE element's second node and the fourth DICE element's second node is connected to a data output part;
and wherein:
each of the first p-type transistor (P1_1), the first n-type transistor (N1_1), the second p-type transistor (P2_1), the second n-type transistor (N2_1), the third p-type transistor (P3_1), the third n-type transistor (N3_1), the fourth p-type transistor (P4_1) and the fourth n-type transistor (N4_1) is configured such that three transistors for redundancy are added thereto at respective positions consisting of a serial position, a parallel position and a parallel-serial position so as to form a four-transistor circuit in which a serially duplicated circuit is duplicated in parallel; and each of the first data input part and the second data input part is made dually redundant.

2. The single event upset-tolerant latch circuit as recited in claim 1, wherein each of the redundant first, second, third and fourth DICE elements is configured such that a connection with a positive power supply or a negative power supply is controlled by control of a clock having a phase reverse to that of the clock for controlling the first and second data input parts.

3. The single event upset-tolerant latch circuit as recited in claim 2, wherein, the transistor subject to redundancy and the parallel-duplicating transistor are configured such that gate terminals thereof are connected to a common line;

the serially-duplicating transistor and the parallel-serially-duplicating transistor are configured such that gate terminals thereof are connected to a common line;

the transistor subject to redundancy and the serially-duplicating transistor are connected in series; and the parallel-duplicating transistor and the parallel-serially-duplicating transistor are connected in series.

4. The single event upset-tolerant latch circuit as recited in claim 3, wherein the serial, parallel and parallel-serial duplications are implemented by:

connecting first to fourth serially-duplicating p-type transistors (P1_2, P2_2, P3_2, P4_2) in series, respectively, to negative power supply ($V_{SS}$) sides of the first to fourth p-type transistors (P_1, P2_1, P3_1, P4_1) each constituting a respective one of the first to fourth DICE elements, and connecting four serially-duplicating n-type transistors (N1_2, N2_2, N3_2, N4_2) in series, respectively, to positive power supply ($V_{DD}$) sides of the four n-type transistors (N1_1, N2_1, N3_1, N4_1) each constituting a respective one of the redundant first to fourth DICE elements;

connecting first to fourth parallel-duplicating p-type transistors (P1_3, P2_3, P3_3, P4_3) whose gate terminals are connected, respectively, to gate terminals of the first to fourth p-type transistors (P1_1, P2_1, P3_1, P4_1) each constituting a respective one of the redundant first to fourth DICE elements, and first to fourth parallel-serially-duplicating p-type transistors (P1_4, P2_4, P3_4, P4_4) whose gate terminals are connected, respectively, to gate terminals of the first to fourth serially-duplicating p-type transistors (P1_2, P2_2, P3_2, P4_2) each constituting a respective one of the redundant first to fourth DICE elements, in series, said serially connected p-type transistors (P1_3-P1_4, P2_3-P2_4, P3_3-P3_4, P4_3-P4_4) respectively being placed between positive power supply ($V_{DD}$) sides and respective gate terminals of the first to fourth n-type transistors (N1_1, N_1, N3_1, N4_1); and connecting first to fourth parallel-duplicating n-type transistors (N1_3, N2_3, N3_3, N4_3) whose gate terminals are connected, respectively, to gate terminals of the first to fourth n-type transistors (N1_1, N_1, N3_1, N4_1) each constituting a respective one of the redundant first to fourth DICE elements, and first to fourth parallel-serially-duplicating n-type transistors (N1_4, N2_4, N3_4, N4_4) whose gate terminals are connected, respectively, to gate terminals of the first to fourth serially-duplicating n-type transistors (N1_2, N2_2, N3_2, N4_2) each constituting a respective one of the redundant first to fourth DICE elements, in series, said serially connected n-type transistors (N1_3-N1_4, N2_3-N2_4, N3_3-N3_4, N4_3-N4_4) respectively being placed between negative power supply ($V_{SS}$) sides and respective gate terminals of the first to fourth p-type transistors (P1_1, P2_1, P3_1, P4_1).

5. The single event upset-tolerant latch circuit as recited in claim 4, wherein, the common line connecting the gate terminals of the serially-duplicating p-type transistor and the parallel-serially-duplicating p-type transistor is connected to a drain terminal side of the serially-duplicating n-type transistor connected in series to the n-type transistor subject to redundancy, to form a duplicated and redundant DICE element's first node, and the common line connecting the gate terminals of the serially-duplicating n-type transistor and the parallel-serially-duplicating n-type transistor is connected to a drain terminal side of the serially-duplicating p-type transistor connected in series to the p-type transistor subjected to redundancy, to form a duplicated and redundant DICE element's second node.

6. The single event upset-tolerant latch circuit as recited in claim 5, wherein:

a node interconnecting between the gate terminal of the first p-type transistor (P1_1) comprised in the redundant first DICE element and the drain terminal of the first parallel-serially-duplicating n-type transistor (N1_4) comprised in the redundant first DICE element is a redundant first DICE element's first node (X4-1);

a node interconnecting between the gate terminal of the second p-type transistor (P2_1) comprised in the redundant second DICE element and the drain terminal of the second parallel-serially-duplicating n-type transistor (N2_4) comprised in the redundant second DICE element is a redundant second DICE element's first node (X1-1), wherein the redundant second DICE element's first node (X1-1) is connected to the redundant first data input part;

a node interconnecting between the gate terminal of the third p-type transistor (P3_1) comprised in the redundant third DICE element and the drain terminal of the third parallel-serially-duplicating n-type transistor (N3_4) comprised in the redundant third DICE element is a redundant third DICE element's first node (X2-1);

a node interconnecting between the gate terminal of the fourth p-type transistor (P4_1) comprised in the redundant fourth DICE element and the drain terminal of the fourth parallel-serially-duplicating n-type transistor (N4_4) comprised in the redundant fourth DICE element is a redundant fourth DICE element's first node (X3-1), wherein the redundant fourth DICE element's first node (X3-1) is connected to the redundant second data input part;

a node interconnecting between the gate terminal of the first serially-duplicating p-type transistor (P1_2) comprised in the redundant first DICE element and the drain terminal of the first serially-duplicating n-type transistor (N1_2) comprised in the redundant first DICE element forms a redundant first DICE element's duplicating first node (X4-2);

a node interconnecting between the gate terminal of the second serially-duplicating p-type transistor (P2_2) comprised in the redundant second DICE element and the drain terminal of the second serially-duplicating n-type transistor (N2_2) comprised in the redundant second DICE element forms a redundant second DICE element's duplicating first node (X1-2), wherein the redundant second DICE element's duplicating first node (X1-2) is connected to the redundant first data input part;

a node interconnecting between the gate terminal of the third serially-duplicating p-type transistor (P3_2) comprised in the redundant third DICE element and the drain terminal of the third serially-duplicating n-type transistor (N3_2) comprised in the redundant third DICE element forms a redundant third DICE element's duplicating first node (X2-2);

a node interconnecting between the gate terminal of the fourth serially-duplicating p-type transistor (P4_2) comprised in the redundant fourth DICE element and the drain terminal of the fourth serially-duplicating n-type transistor (N4_2) comprised in the redundant fourth DICE element forms a redundant fourth DICE element's duplicating first node (X3-2), wherein the redundant fourth DICE element's duplicating first node (X3-2) is connected to the redundant second data input part;

a node interconnecting between the drain terminal of the first serially-duplicating p-type transistor (P1_2) comprised in the redundant first DICE element and the gate terminal of the first serially-duplicating n-type transistor (N1_2) comprised in the redundant first DICE element is a redundant first DICE element's second node (X1-1);

a node interconnecting between the drain terminal of the second serially-duplicating p-type transistor (P2_2) comprised in the redundant second DICE element and the gate terminal of the second serially-duplicating n-type transistor (N2_2) comprised in the redundant second DICE element is a redundant second DICE element's second node (X2-1);

a node interconnecting between the drain terminal of the third serially-duplicating p-type transistor (P3_2) comprised in the redundant third DICE element and the gate terminal of the third serially-duplicating n-type transistor (N3_2) comprised in the redundant third DICE element is a redundant third DICE element's second node (X3-1);

a node interconnecting between the drain terminal of the fourth serially-duplicating p-type transistor (P4_2) comprised in the redundant fourth DICE element and the gate terminal of the fourth serially-duplicating n-type transistor (N4_2) comprised in the redundant fourth DICE element is a redundant fourth DICE element's second node (X4-1);

a node interconnecting between the drain terminal of the first parallel-serially-duplicating p-type transistor (P1_4) comprised in the redundant first DICE element and the gate terminal of the first n-type transistor (N1_1) comprised in the redundant first DICE element forms a redundant first DICE element's duplicating second node (X1-2);

a node interconnecting between the drain terminal of the second parallel-serially-duplicating p-type transistor (P2_4) comprised in the redundant second DICE element and the gate terminal of the second n-type transistor (N2_1) comprised in the redundant second DICE element forms a redundant second DICE element's duplicating second node (X2-2);

a node interconnecting between the drain terminal of the third parallel-serially-duplicating p-type transistor (P3_4) comprised in the redundant third DICE element and the gate terminal of the third n-type transistor (N3_1) comprised in the redundant third DICE element forms a redundant third DICE element's duplicating second node (X3-2); and a node interconnecting between the drain terminal of the fourth parallel-serially-duplicating p-type transistor (P4_4) comprised in the redundant fourth DICE element and the gate terminal of the fourth n-type transistor (N4_1) comprised in the redundant fourth DICE element forms a redundant fourth DICE element's duplicating second node (X4-2);

wherein:
the redundant first DICE element's first node (X4-1) is connected to the redundant fourth DICE element's second node (X4-1);
the redundant second DICE element's first node (X1-1) is connected to the redundant first DICE element's second node (X1-1);
the redundant third DICE element's first node (X2-1) is connected to the redundant second DICE element's second node (X2-1);
the redundant fourth DICE element's first node (X3-1) is connected to the redundant third DICE element's second node (X3-1);
the redundant first DICE element's duplicating first node (X4-2) is connected to the redundant fourth DICE element's duplicating second node (X4-2);
the redundant second DICE element's duplicating first node (X1-2) is connected to the redundant first DICE element's duplicating second node (X1-2);
the redundant third DICE element's duplicating first node (X2-2) is connected to the redundant second DICE element's duplicating second node (X2-2); and
the redundant fourth DICE element's duplicating first node (X3-2) is connected to the redundant third DICE element's duplicating second node (X3-2).

7. The single event upset-tolerant latch circuit as recited in claim 6, wherein, with regard to fourteen combinations of three critical transistors whose simultaneous inversion can cause single event upset, at least two of three transistors in the same combination are arranged on a vertical or horizontal straight line at a given inter-gate distance in a circuit layout thereof, wherein the fourteen combinations consist of:

(1) a combination of the first serially-duplicating p-type transistor (P1_2) comprised in the redundant first DICE element, the first parallel-serially-duplicating p-type transistor (P1_4) comprised in the redundant first DICE element, and the third serially-duplicating n-type transistor (N3_2) comprised in the redundant third DICE element;

(2) a combination of the first serially-duplicating p-type transistor (P1_2) comprised in the redundant first DICE element, the first parallel-serially-duplicating p-type transistor (P1_4) comprised in the redundant first DICE element, and the third parallel-serially-duplicating n-type transistor (N3_4) comprised in the redundant third DICE element;

(3) a combination of the first serially-duplicating n-type transistor (N1_2) comprised in the redundant first DICE element, the first parallel-serially-duplicating n-type transistor (N1_4) comprised in the redundant first DICE element, and the third serially-duplicating n-type transistor (N3_2) comprised in the redundant third DICE element;

(4) a combination of the first serially-duplicating n-type transistor (N1_2) comprised in the redundant first DICE element, the first parallel-serially-duplicating n-type transistor (N1_4) comprised in the redundant first DICE element, and the third parallel-serially-duplicating n-type transistor (N3_4) comprised in the redundant third DICE element;

(5) a combination of the first serially-duplicating n-type transistor (N1_2) comprised in the redundant first DICE element, the third serially-duplicating p-type transistor (P3_2) comprised in the redundant third DICE element, and the third parallel-serially-duplicating p-type transistor (P3_4) comprised in the redundant third DICE element;

(6) a combination of the first parallel-serially-duplicating n-type transistor (N1_4) comprised in the redundant first DICE element, the third serially-duplicating p-type transistor (P3_2) comprised in the redundant third DICE element, and the third parallel-serially-duplicating p-type transistor (P3_4) comprised in the redundant third DICE element;

(7) a combination of the first serially-duplicating n-type transistor (N1_2) comprised in the redundant first DICE element, the third serially-duplicating n-type transistor (N3_2) comprised in the redundant third DICE element, and the third parallel-serially-duplicating n-type transistor (N3_4) comprised in the redundant third DICE element;

(8) a combination of the first parallel-serially-duplicating n-type transistor (N1_4) comprised in the redundant first DICE element, the third serially-duplicating n-type transistor (N3_2) comprised in the redundant third DICE element, and the third parallel-serially-duplicating n-type transistor (N3_4) comprised in the redundant third DICE element;

(9) a combination of the second serially-duplicating p-type transistor (P2_2) comprised in the redundant second DICE element, the second parallel-serially-duplicating p-type transistor (P2_4) comprised in the redundant second DICE element, and the fourth serially-duplicating n-type transistor (N4_2) comprised in the redundant fourth DICE element;

(10) a combination of the second serially-duplicating p-type transistor (P2_2) comprised in the redundant second DICE element, the second parallel-serially-duplicating p-type transistor (P2_4) comprised in the redundant second DICE element, and the fourth parallel-serially-duplicating n-type transistor (N4_4) comprised in the redundant fourth DICE element;

(11) a combination of the second serially-duplicating n-type transistor (N2_2) comprised in the redundant second DICE element, the second parallel-serially-duplicating n-type transistor (N2_4) comprised in the redundant second DICE element, and the fourth serially-duplicating n-type transistor (N4_2) comprised in the redundant fourth DICE element;

(12) a combination of the second serially-duplicating n-type transistor (N2_2) comprised in the redundant second DICE element, the second parallel-serially-duplicating n-type transistor (N2_4) comprised in the redundant second DICE element, and the fourth parallel-serially-duplicating n-type transistor (N4_4) comprised in the redundant fourth DICE element;

(13) a combination of the second parallel-serially-duplicating n-type transistor (N2_4) comprised in the redundant second DICE element, the fourth serially-duplicating p-type transistor (P4_2) comprised in the redundant fourth DICE element, and the fourth parallel-serially-duplicating p-type transistor (P4_4) comprised in the redundant fourth DICE element; and

(14) a combination of the second parallel-serially-duplicating n-type transistor (N2_4) comprised in the redundant second DICE element, the fourth serially-duplicating n-type transistor (N4_2) comprised in the redundant fourth DICE element, and the fourth parallel-serially-duplicating n-type transistor (N4_4) comprised in the redundant fourth DICE element.

8. The single event upset-tolerant latch circuit as recited in claim 7, wherein:

the redundant first data input part comprises two transmission gates, wherein two outputs of the transmission gates are connected, respectively, to the redundant second DICE element's first node, and the redundant second DICE element's duplicating first node; and the redundant second data Input part comprises two transmission gates, wherein two outputs of the transmission gates are connected, respectively, to the redundant fourth DICE element's first node, and the redundant fourth DICE element's duplicating first node.

9. The single event upset-tolerant latch circuit as recited in claim 1, which has a circuit layout in which:

circuits of the redundant first DICE element and the redundant fourth DICE element are arranged one-above-the-other;

circuits of the redundant third DICE element and the redundant second DICE element are arranged one-above-the-other; and a circuit other than the circuits of the redundant first DICE element, the redundant second DICE element, the redundant third DICE element and the redundant fourth DICE element is disposed between a set of the redundant first DICE element and the redundant fourth DICE element arranged one-above-the-other and a set of the redundant third DICE element and the redundant second DICE element arranged one-above-the-other.

10. The single event upset-tolerant latch circuit as recited in claim 1, wherein:

each of the first p-type transistor (P1_1), the first n-type transistor (N1_1), the second p-type transistor (P2_1), the second n-type transistor (N2_1), the third p-type transistor (P3_1), the third n-type transistor (N3_1), the fourth p-type transistor (P4_1) and the fourth n-type transistor (N4_1) is configured such that eight transistors for redundancy are added thereto at respective positions so as to form an nine-transistor circuit in which a serially triplicated circuit is triplicated in parallel, and each of the first data input part and the second data input part is configured to allow the resulting redundant circuit to accept an input from the same data source through three transmission gates.

11. The single event upset-tolerant latch circuit as recited in claim 1, wherein the p-type transistor and the n-type transistor includes the first p-type transistor (P1_1), the first n-type transistor (N1_1), the second p-type transistor (P2_1), the second n-type transistor (N2_1), the third p-type transistor (P3_1), the third n-type transistor (N3_1), - - - , a k-th p-type transistor (Pk_1) and a k-th n-type transistor (Nk_1) (where k is an integer of 4 or more), wherein each of the first p-type transistor (P1_1), the first n-type transistor (N1_1), - - - , the k-th p-type transistor (Pk_1) and the k-th n-type transistor (Nk_1) is configured such that $(k^2-1)$ transistors for redundancy are added thereto at respective positions so as to form a $k^2$-transistor circuit in which a serially k-plicated circuit is k-plicated in parallel; and each of the first data input part and the second data input part is configured to allow each node to accept an input from the same data source through k transmission gates.

12. A single event upset-tolerant flip-flop circuit comprising a front-stage master part and a rear-stage slave part each comprising a single event upset-tolerant latch circuit, wherein
an output of the single event upset-tolerant latch circuit in the master part is connected to an input of the single event upset-tolerant latch circuit in the slave part, and
a clock having a phase reverse to that of a clock to be input to the single event upset-tolerant latch circuit in the master part is input to the single event upset-tolerant latch circuit in the slave part, wherein the single event upset-tolerant latch circuit is configured such that four Dual Interlocked Storage Cell (DICE) elements are connected in series and in a loop configuration, each of the DICE elements being comprised of a p-type transistor and an n-type transistor, wherein a gate terminal in each one of the p-type and n-type transistors and a drain terminal in the other are mutually connected, each of the DICE elements having a first node interconnecting between the gate terminal of the p-type transistor and the drain terminal of the n-type transistor, and a second node interconnecting between the drain terminal of the p-type transistor and the gate terminal of the n-type transistor, the single event upset-tolerant latch circuit comprising:
a first DICE element comprised of a first p-type transistor (P1_1) and a first n-type transistor (N1_1), wherein a gate terminal in each one of the first p-type and n-type transistors and a drain terminal in the other are mutually connected;
a second DICE element comprised of a second p-type transistor (P2_1) and a second n-type transistor (N2_1), wherein a gate terminal in each one of the second p-type and n-type transistors and a drain terminal in the other are mutually connected;
a third DICE element comprised of a third p-type transistor (P3_1) and a third n-type transistor (N3_1), wherein a gate terminal in each one of the third p-type and n-type transistors and a drain terminal in the other are mutually connected; and
a fourth DICE element comprised of a fourth p-type transistor P4_1) and a fourth n-type transistor (N4_1), wherein a gate terminal in each one of the fourth p-type and n-type transistors and a drain terminal in the other are mutually connected;
wherein:
a node interconnecting between a gate terminal of a p-type transistor comprised in the first DICE element and a drain terminal of an n-type transistor comprised in the first DICE element forms a first DICE element's first node;
a node interconnecting between a gate terminal of a p-type transistor comprised in the second DICE element and a drain terminal of an n-type transistor comprised in the second DICE element forms a second DICE element's first node;
a node interconnecting between a gate terminal of a p-type transistor comprised in the third DICE element and a drain terminal of an n-type transistor comprised in the third DICE element forms a third DICE element's first node;
a node interconnecting between a gate terminal of a p-type transistor comprised in the fourth DICE element and a drain terminal of an n-type transistor comprised in the fourth DICE element forms a fourth DICE element's first node;
a node interconnecting between a drain terminal of a p-type transistor comprised in the first DICE element and a gate terminal of an n-type transistor comprised in the first DICE element forms a first DICE element's second node;
a node interconnecting between a drain terminal of a p-type transistor comprised in the second DICE element and a gate terminal of an n-type transistor comprised in the second DICE element forms a second DICE element's second node;
a node interconnecting between a drain terminal of a p-type transistor comprised in the third DICE element and a gate terminal of an n-type transistor comprised in the third DICE element forms a third DICE element's second node; and
a node interconnecting between a drain terminal of a p-type transistor comprised in the fourth DICE element and a gate terminal of an n-type transistor comprised in the fourth DICE element forms a fourth DICE element's second node;
and wherein:
the first DICE element's first node is connected to the fourth DICE element's second node;
the second DICE element's first node is connected to the first DICE element's second node;
the third DICE element's first node is connected to the second DICE element's second node; and
the fourth DICE element's first node is connected to the third DICE element's second node;
and wherein:
the second DICE element's first node and the fourth DICE element's first node are connected, respectively, to a first data input part and a second data input part each configured such that a conduction state thereof is controlled by control of a clock; and
at least one of the first DICE element's second node, the second DICE element's second node, the third DICE element's second node and the fourth DICE element's second node is connected to a data output part;
and wherein:
each of the first p-type transistor (P1_1), the first n-type transistor N1_1), the second p-type transistor (P2_1), the second n-type transistor (N2_1), the third p-type transistor (P3_1), the third n-type transistor (N3_1), the fourth p-type transistor (P4_1) and the fourth n-type transistor (N4_1) is configured such that three transistors for redundancy are added thereto at respective positions consisting of a serial position, a parallel position and a parallel-serial position so as to form a four-transistor circuit in which a serially duplicated circuit is duplicated in parallel; and
each of the first data input part and the second data input part is made dually redundant.

* * * * *